US009330877B2

(12) United States Patent
Eden et al.

(10) Patent No.: US 9,330,877 B2
(45) Date of Patent: May 3, 2016

(54) LOGIC FUNCTION GENERATION FROM SINGLE MICROPLASMA TRANSISTOR DEVICES AND ARRAYS OF DEVICES

(71) Applicant: The Board of Trustees of the University of Illinois, Urbana, IL (US)

(72) Inventors: J. Gary Eden, Champaign, IL (US); Paul A. Tchertchian, Mission Viejo, CA (US); Clark J. Wagner, Rowland Heights, CA (US); Dane J. Sievers, Fisher, IL (US); Thomas J. Houlahan, Urbana, IL (US); Benben Li, Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 14/727,156

(22) Filed: Jun. 1, 2015

(65) Prior Publication Data

US 2015/0294831 A1 Oct. 15, 2015

Related U.S. Application Data

(60) Division of application No. 14/452,032, filed on Aug. 5, 2014, which is a continuation-in-part of application No. 13/186,401, filed on Jul. 19, 2011, now Pat. No. 8,816,435.

(60) Provisional application No. 61/365,429, filed on Jul. 19, 2010.

(51) Int. Cl.
*H01L 29/66* (2006.01)
*H01J 17/36* (2006.01)
(Continued)

(52) U.S. Cl.
CPC ............. *H01J 17/36* (2013.01); *H01J 17/066* (2013.01); *H01J 17/49* (2013.01); *H01J 17/497* (2013.01); *H01L 29/66234* (2013.01); *H01L 29/73* (2013.01); *H01L 33/02* (2013.01)

(58) Field of Classification Search
CPC .... H01L 29/66234; H01L 29/73; H01L 33/08
USPC ........................................................ 326/124
See application file for complete search history.

(56) References Cited

U.S. PATENT DOCUMENTS 4,683,399 A 7/1987 Soclof
5,485,025 A 1/1996 Chau et al.
(Continued)

FOREIGN PATENT DOCUMENTS

WO 2007087371 A2 8/2007

OTHER PUBLICATIONS

Chen, K.-F., et al., "The plasma transistor: A microcavity plasma device coupled with a low voltage, controllable electron emitter", Applied Physics Letters, 93, 161501, 2008, 3 pages.
(Continued)

*Primary Examiner* — Mark Prenty
(74) *Attorney, Agent, or Firm* — Greer, Burns & Crain, Ltd.

(57) ABSTRACT

Logic devices are provided in multiple sub-collector and sub-emitter microplasma devices formed in thin and flexible, or inflexible, semiconductor materials. Logic operations are provided with one of a plurality of microplasmas forming sub-collectors with a common emitter, or a common collector plasma with a plurality of sub-emitter regions in a solid state semi-conductor pn-junction, and generating a logic output from an electrode, based upon electrode inputs to two other electrodes.

17 Claims, 29 Drawing Sheets

(51) Int. Cl.
*H01L 29/73* (2006.01)
*H01J 17/06* (2006.01)
*H01J 17/49* (2012.01)
*H01L 33/02* (2010.01)

(56) References Cited

U.S. PATENT DOCUMENTS

| | | | |
|---|---|---|---|
| 5,765,073 | A | 6/1998 | Schoenbach et al. |
| 6,016,027 | A | 1/2000 | DeTemple et al. |
| 6,139,384 | A | 10/2000 | DeTemple et al. |
| 6,194,833 | B1 | 2/2001 | DeTemple et al. |
| 6,815,891 | B2 | 11/2004 | Eden et al. |
| 6,970,219 | B1 | 11/2005 | Hermann |
| 7,112,918 | B2 | 9/2006 | Eden et al. |
| 7,235,860 | B2 | 6/2007 | Ohki |
| 7,679,164 | B2 | 3/2010 | Pagette et al. |
| 2005/0253290 | A1 | 11/2005 | Yokoyama et al. |
| 2006/0082319 | A1 | 4/2006 | Eden et al. |
| 2010/0289413 | A1 | 11/2010 | Eden et al. |
| 2011/0037102 | A1 | 2/2011 | Tchertchian et al. |
| 2012/0025696 | A1 | 2/2012 | Eden et al. |
| 2015/0294831 | A1* | 10/2015 | Eden ............ H01L 29/73 315/35 |

OTHER PUBLICATIONS

Eden, J. Gary, et al., "Microplasma Channels and Large Arrays: Applications to Photomedicine, Microlasers, and Reactors on a Chip", Final Report on AFOSR Grant No. FA9550-07-1-0003, Sep. 29, 2006-Sep. 30, 2009, Oct. 2009, 20 pages.

Park, S.-J., et al., "Flexible microdischarge arrays: Metal/polymer devices", Applied Physics Letters, vol. 77, No. 2, Jul. 10, 2000, pp. 199-201.

Park, S.-J., et al., "Arrays of microdischarge devices having 50-100µm square pyramidal Si anodes and screen cathodes", Electronics Letters, vol. 37, No. 3, Feb. 1, 2001, pp. 171-172.

Physorg.com, "Scientist fabricate first plasma transistor", www.physorg.com/news145705715.html, Nov. 12, 2008, 2 pages.

Sciencedaily, "New Plasma Transistor Could Create Sharper Displays", http://www.sciencedaily.com/releases/2009/02/090204131617.htm, Feb. 17, 2009, 2 pages.

Sordan, Roman, et al., "Logic gates with a single graphene transistor", Applied Physics Letters, 94, (2009), pp. 073305-1-073305-3.

Tarighat, Roohollah, S., et. al., "Realization of Flexible Plasma Display Panels on PET Substrates", Proceeding of the IEEE, vol. 93, No. 7, Jul. 2005, 7 pages.

* cited by examiner

Top View

Cross Sectional View

Top View

Cross Sectional View

Top View

Cross Sectional View

LOGIC FUNCTION GENERATION FROM SINGLE MICROPLASMA TRANSISTOR DEVICES AND ARRAYS OF DEVICES

PRIORITY CLAIM AND REFERENCE TO RELATED APPLICATION

This application is a divisional of prior application Ser. No. 14/452,032, filed Aug. 5, 2014, and now U.S. Pat. No. 9,263,558, issued Feb. 16, 2016, which application was continuation-in-part of and claims priority under 35 U.S.C. §120 from prior application Ser. No. 13/186,401, now U.S. Pat. No. 8,816,435, issued on Aug. 26, 2014, which claims priority under 35 U.S.C. §119 from prior provisional application Ser. No. 61/365,429, which was filed Jul. 19, 2010.

STATEMENT OF GOVERNMENT INTEREST

This invention was made with government support under Grant No. FA-9550-07-1-0003, and FA-9550-10-1-0456 awarded by the United States Air Force Office of Scientific Research. The government has certain rights in the invention.

FIELD

Fields of the invention include microplasma and macroplasma generation, and logic devices. Applications of the invention include semiconductor devices, optoelectronics, photonics, microelectronics, and plasma electronics.

BACKGROUND

Modern electronics rely on solid state materials and semiconductors, in particular. However, plasma-based electronic devices assumed a significant role in communications and display systems in the first half of the 20$^{th}$ century. Vacuum tubes were previously used to amplify and switch signals, but have been largely replaced by solid state devices. Vacuum tubes continue, however, to be employed in specialized applications such as in the final amplifier of high power radio transmitters.

Macroplasma devices have also been used in older communications and display systems. One example is the plasma electron tube (such as the OA, OB, OC, and OD series of rare gas-plasma voltage regulators) that was widely incorporated into audio equipment as well as the power supplies of RF transmitters and receivers. Other examples include plasma switches and the 866A and 872 mercury plasma high voltage rectifiers that found application in early RF transmitters. Another example is the Nixie tube, a neon plasma based device that was an essential component of alphanumeric displays for a number of decades in the twentieth century.

Subsequent applications of plasmas to electronics or displays have often required imposing external voltages or magnetic fields so as to influence the electromagnetic field distribution in the plasma. For example, U.S. Pat. No. 5,765,073 discloses a field controlled plasma discharge display element serving as a light source element in plasma discharge electrostatic printers. The display element includes a pair of discharge electrodes and a third electrode positioned external and proximate to the discharge electrodes for the purpose of generating a control electric field. This control electric field is able to vary the intensity of the plasma discharge and its spatial distribution by distorting the shape of the discharge electric field. In this and other similar devices, a degree of control over the properties of a plasma is exerted by an auxiliary device or structure, where "auxiliary" indicates that the added device or structure is not required for sustenance of the plasma. Soclof U.S. Pat. No. 4,683,399 summarizes typical prior devices that inject electrons into vacuum with a reverse-biased pn junction, and subsequently accelerate and collect the electrons with an anode.

Most commercially available displays are rigid and somewhat fragile. Despite these limitations, large displays such as flat panel TVs having screen sizes as large as >60" have proven to be extremely successful. It is expected and would be desirable for the next generation of displays to be required to be lightweight (e.g., <100 g/ft$^2$), manufacturable by inexpensive processes at sizes of 10 m$^2$ and above (to full "wall size") and, if possible, flexible. Existing large area LED displays are certainly bright but the cost is exorbitant (>$1 k per square foot) and such displays are certainly not flexible.

In U.S. Pat. No. 7,235,860, Ohki describes a solid state transistor in which the emitter is sub-divided into separate sub-emitters. However, the purpose of subdividing the emitter is only to increase emitter current while maintaining $h_{fe}$. The emitters are electronically isolated from each other by an isolation region. Varying their surface area (i.e., the area exposed to the base) serves to control the maximum emitter current.

SUMMARY OF THE INVENTION

Preferred methods of the invention provide logic functions with a single microplasma transistor device. A microplasma is generated within a microcavity in proximity to a solid state semiconductor pn junction. Logic operations are provided with one of a plurality of microplasmas forming sub-collectors with a common emitter, or a common collector plasma with a plurality of sub-emitter regions in a solid state semiconductor pn-junction, and generating a logic output from an electrode based upon electrode inputs to two other electrodes.

Preferred embodiments make use of a hybrid plasma semiconductor device. The device has a thin and flexible semiconductor base layer. An emitter region is diffused into the base layer, forming a pn-junction. An insulator layer is upon one side of the base layer and emitter region. Base and emitter electrodes are isolated from each other by the insulator layer and electrically contact the base layer and emitter region through the insulator layer. A thin and flexible collector layer is situated on an opposite side of the base layer. A microcavity is formed in the collector layer and is aligned with the emitter region. Collector electrodes are arranged to sustain a microplasma within the microcavity upon the application of a voltage of the proper magnitude to the collector electrodes. A depth of the emitter region and a thickness of the base layer are set to define a predetermined thin portion of the base layer as a base region between the emitter region and the microcavity. Microplasma generated in the microcavity serves as a collector.

A preferred embodiment array of flexible hybrid plasma transistors of the invention is an n$^+$pn plasma bipolar junction transistor (PBJT), fabricated between two flexible sheets, that is able to provide logic functions in the array. One or both of the flexible sheets is transparent. The overall array structure is planar, and the planarized structure is sealed between the two flexible sheets. Visible or ultraviolet light is emitted during operation by plasma collectors in the array. In preferred embodiments, individual PBJTs in the array serve as sub-pixels of a full-color display. Subdividing the plasma collector of a PBJT provides a logic device and/or devices in which multiple visible or ultraviolet wavelengths can be emitted from the collector plasmas. Segmenting the emitter also enables one PBJT to control others that are coupled through a common collector plasma.

Additional preferred embodiment logic devices of the invention are formed in non-flexible materials with sub-divided collectors or subdivided collectors. Preferred materials for non-flexible devices include semiconductor materials or ceramic materials. The materials can be thicker than in the flexible devices. The subdivided plasma collector or emitter provides the same function as in the flexible devices.

DETAILED DESCRIPTION OF THE PREFERRED EMBODIMENTS

Figure 1:
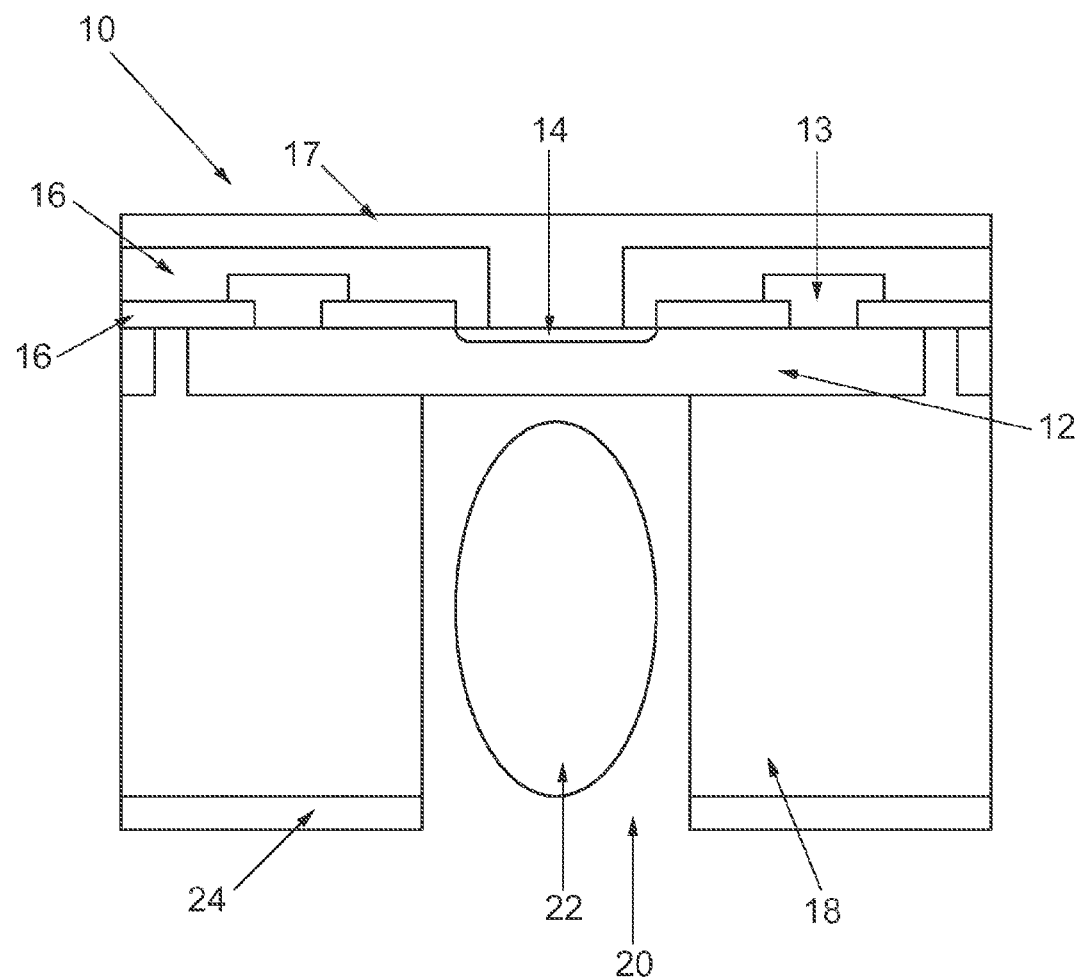
FIG. 1 is a schematic cross-section diagram that shows a preferred embodiment flexible plasma transistor of the invention.

Preferred methods of the invention provide logic functions with a single microplasma transistor device. A microplasma is generated within a microcavity in proximity to a solid state semiconductor pn junction. Logic operations are provided with one of a plurality of microplasmas forming sub-collectors with a common emitter, or a common collector plasma with a plurality of sub-emitter regions in a solid state semiconductor pn-junction, and generating a logic output from an electrode based upon electrode inputs to two other electrodes.

A preferred method for providing a logic function with a single microplasma transistor device includes generating one or a plurality of microplasmas within one or a plurality of microcavities in proximity to one or a plurality of solid state semiconductor pn junctions. Voltage waveforms are applied to affect selected ones of the one or a plurality of microplasmas or the one or plurality of semiconductor pn junctions to influence electrical characteristics of other ones of the plurality of microplasmas or the plurality of semiconductor pn junctions to thereby provide the logic function.

This invention makes use of and provides flexible hybrid plasma transistors and displays that can provide ultra-large area displays and can be manufactured inexpensively. The substrate in the present invention is a flexible material such as plastic, permitting a finished display able to conform to various irregular surfaces. Displays of the invention can be at least partially transparent. The hybrid plasma transistor devices of the invention have multiple sub-emitters or multiple sub-collectors sharing a common base region. These devices support logic operations or multiple-ultraviolet or visible wavelength emissions from a single transistor device. Additional embodiment devices with multiple sub-emitters or multiple sub-collectors are non-flexible and formed in semiconductors that are thicker and non-flexible.

In preferred embodiment arrays and displays, a plasma transistor, such as a plasma bipolar junction transistor (PBJT), is produced using a flexible substrate. In exemplary embodiments, the emitter and base of the transistor are, together, only ~15 µm in thickness (i.e., less than one-thousandth of an inch) and very flexible. A preferred manufacture process is a lift-off-process that begins with silicon-on-insulator (SOI) wafers. Preferred fabrication processes are inexpensive and ideal for transferring the transistor emitter and base, fabricated in a semiconductor, e.g., Si, to a plastic substrate or other flexible substrate.

A preferred embodiment array of flexible hybrid plasma transistors of the invention is an $n^+pn$ PBJT fabricated between two flexible sheets. One or both of the flexible sheets is transparent. The overall array structure is planar, and the planarized structure is sealed between the two flexible sheets. Visible or ultraviolet light is emitted during operation by plasma collectors in the array. In preferred embodiments, individual PBJTs in the array serve as sub-pixels of a full-color display.

The invention provides flexible combination semiconductor and plasma devices, including transistors and phototransistors. Devices of the invention are referred to as hybrid plasma-semiconductor devices, in which a plasma, preferably a microplasma, cooperates with conventional solid state semiconductor device regions to influence or perform a semiconducting function, such as that provided by a transistor. The plasma can perform or influence electronic or photonic semiconducting functions. The invention provides a family of hybrid plasma electronic/photonic devices having properties believed to be previously unavailable. In flexible transistor devices of the invention, a low temperature, glow discharge is integral to the hybrid transistor. Exemplary preferred devices include hybrid BJT and MOSFET devices.

A preferred embodiment flexible hybrid plasma semiconductor device has at least one active solid state semiconductor region; and a plasma generated in proximity to the active solid state semiconductor region(s).

Preferred embodiments of the invention will now be discussed with respect to the drawings. The drawings include schematic representations that will be understood by artisans in view of the general knowledge in the art of the description that follows. Features can be exaggerated in the drawings for emphasis, and features may not be to scale. Artisans will recognize broader aspects of the invention from the description of the preferred embodiments.

Artisans will also appreciate that various features shown in some of the figures can be used in devices shown in other figures. Some of the drawing figures are simplified for purposes of clarity of application. For example, vias illustrated in a single figure can be used in other figures. Similarly, windows, covers, electrodes and other features may be shown in selected ones of the figures but omitted in others to simplify the illustrations and emphasize certain features. Artisans will recognize those features that can be used in some or all of the devices.

FIG. 1 is a cross-sectional diagram (not drawn to scale) of a preferred embodiment flexible plasma transistor 10 of the invention of the invention. The npn device has a p-type base 12 into which an n-type emitter 14 is diffused. Electrical contact via base metal electrode 13 to the base 12 is made through openings etched in a dielectric, e.g., silicon dioxide ($SiO_2$), insulating film 16. Dielectrics other than $SiO_2$, such as $Y_2O_3$ and $Si_3N_4$, are also acceptable insulating materials. Additional dielectric 16 isolates emitter electrode metal 17 from base metal electrode 13. The base and emitter of the transistor are joined to a non-conducting flexible material 18 such as a thin plastic sheet. A cavity 20 formed in the flexible substrate is aligned with the n-type emitter 14. Plasma 22 formed within the cavity serves as the collector of the npn transistor and the cavity will generally have a characteristic transverse dimension in the range of 5 µm to several mm. The flexible substrate is nonconducting electrically but the surface on the outer face of the flexible substrate opposite to that from the transistor emitter and base has a thin conducting electrode film which serves as the anode 24 for the collector plasma. The device is sealed by a window material (not shown in FIG. 1) which may be, for example, thin glass or plastic. As seen in FIG. 1, the entire device can be "planarized", forming a flat plane on both opposite sides.

Rather than sealing the window directly to the anode, a "standoff" dielectric layer can also be deposited onto the anode layer and patterned so as to allow gas to move freely from one plasma collector cavity to another within an array of the PBJT devices of FIG. 1. Operation of the device of FIG. 1 involves evacuation of the plasma collector cavity, introducing the desired gas, vapor, or mixture thereof at the proper pressure, and applying voltages of the proper magnitude to the emitter-base and collector-emitter junctions. Typically, a DC or time-varying voltage of approximately 0.1 to 10 V is applied to the base-emitter junction whereas the collector-emitter junction normally requires a voltage >100 V, and is dependent upon the dimensions of the collector plasma, the gas or vapor, and its pressure.

Although not shown in FIG. 1, the sidewalls of the plasma collector cavity, as well as the interior surface of the window, can be coated with a thin film of red, green, or blue phosphor for display applications. The thickness of the phosphor film on the cavity sidewalls will likely be different from that on the window in order to maximize the light exiting the collector cavity. Prior to depositing the phosphor, it is desirable to deposit a dielectric film or a thin stack of films, onto the cavity sidewalls in order to inhibit the diffusion of organic vapors from the flexible substrate (which may be a polymer) into the collector plasma.

Figure 2A:
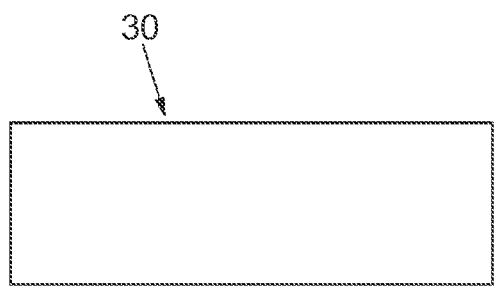
FIGS. 2A-9B illustrate a preferred process sequence for fabricating large arrays of the device of FIG. 1 in polysilicon.
Figure 2B:
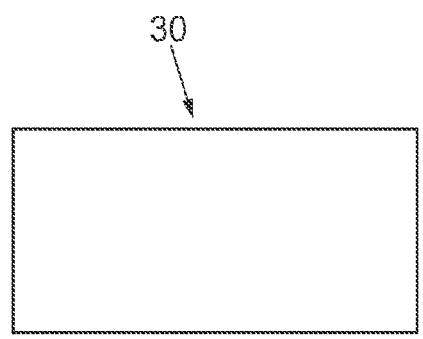
Figure 3A:
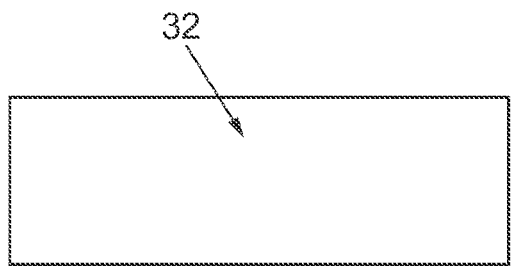
Figure 3B:
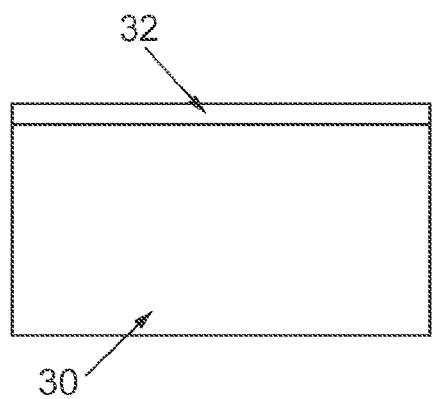
Figure 4A:
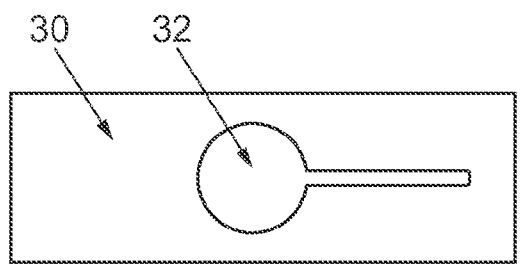
Figure 4B:
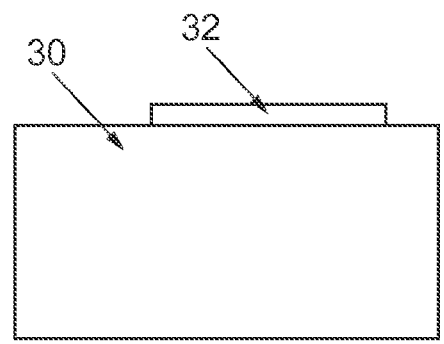
Figure 5A:
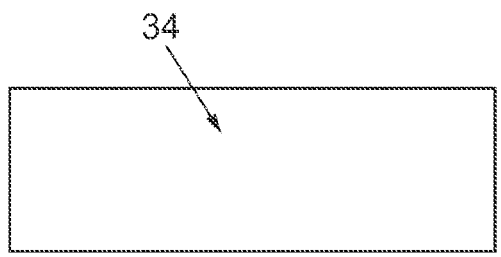
Figure 5B:
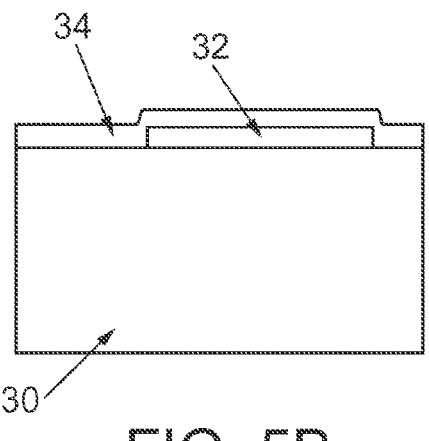
Figure 6A:
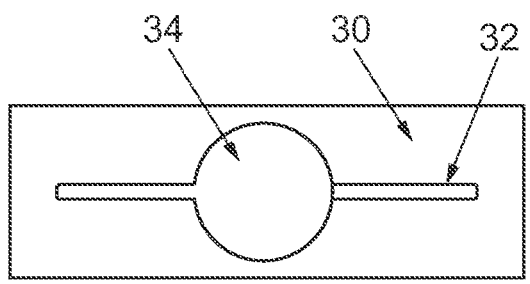
Figure 6B:
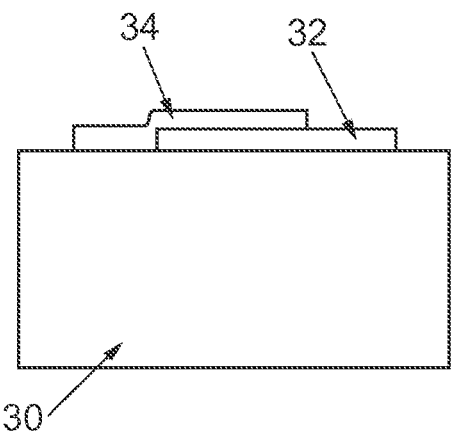
Figure 7A:
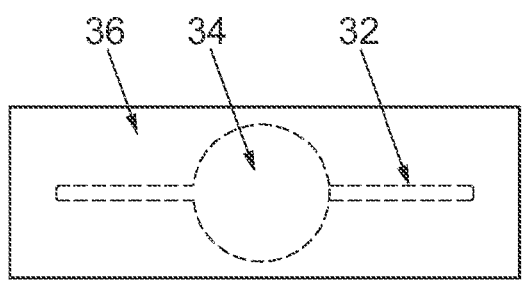
Figure 7B:
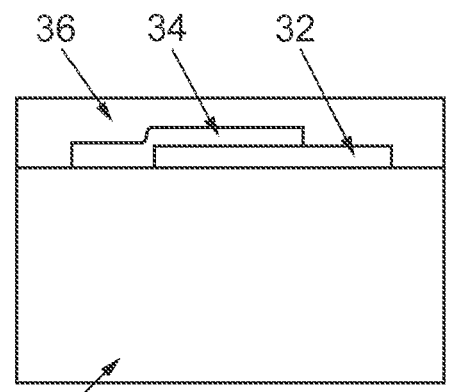
Figure 8A:
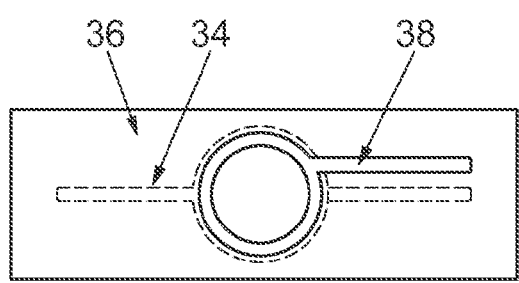
Figure 8B:
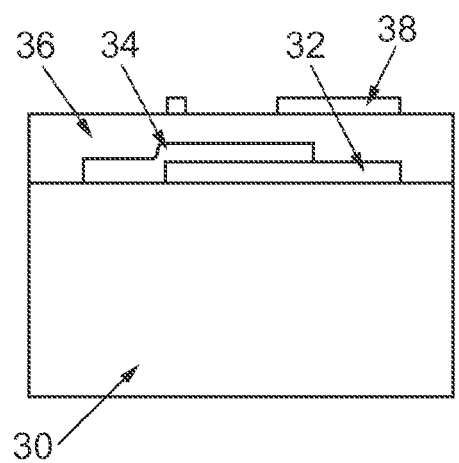
Figure 9A:
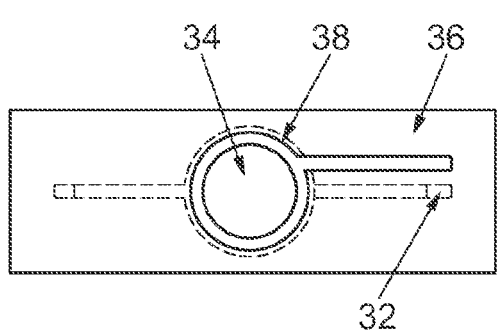
FIGS. 9C-9L illustrate a process for forming as well as a preferred embodiment lateral flexible bipolar junction plasma transistor of the invention.
Figure 9B:
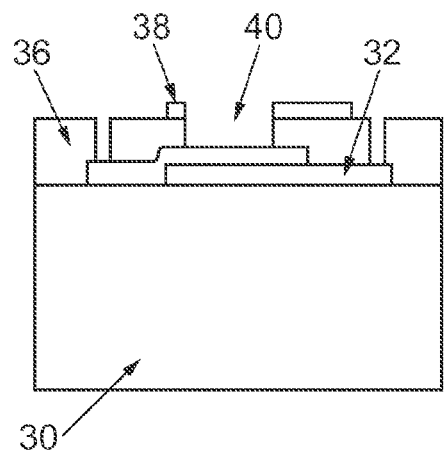

Arrays of FIG. 1 devices can readily be fabricated by microfabrication processes that are well-known to the integrated circuit and MEMs communities. FIGS. 2A-9B, for example, illustrate in detail the fabrication of a device in accordance with FIG. 1 but based upon polycrystalline Si rather than a single crystal semiconductor as in FIG. 1. In FIGS. 2A and 2B, a flexible, non-conducting substrate 30 is provided. In FIGS. 3A and 3B, a polysilicon emitter layer 32 is formed on the substrate 30. The emitter layer 32 is patterned in FIGS. 4A and 4B. In FIGS. 5A and 5B, a base layer 34 is deposited and patterned in FIGS. 6A and 6B. In FIGS. 7A and 7B, dielectric 36 is deposited. In FIGS. 8A and 8B, anode metal 38 is deposited in a pattern. In FIGS. 9A and 9B, the dielectric 36 is patterned to complete the device, which can permit circuit interconnection and provide a microcavity opening 40 that can support plasma generation.

Another embodiment of the invention is a laterally doped PBJT, which is formed such that the entire device is contained within the device layer of a typical silicon-on-insulator (SOI) wafer, and the typical npn stack progresses horizontally, along the surface of the wafer. This device also lends itself readily to flexible applications. Formation of such a device is illustrated in FIGS. 9C-9L.

Figure 9C:
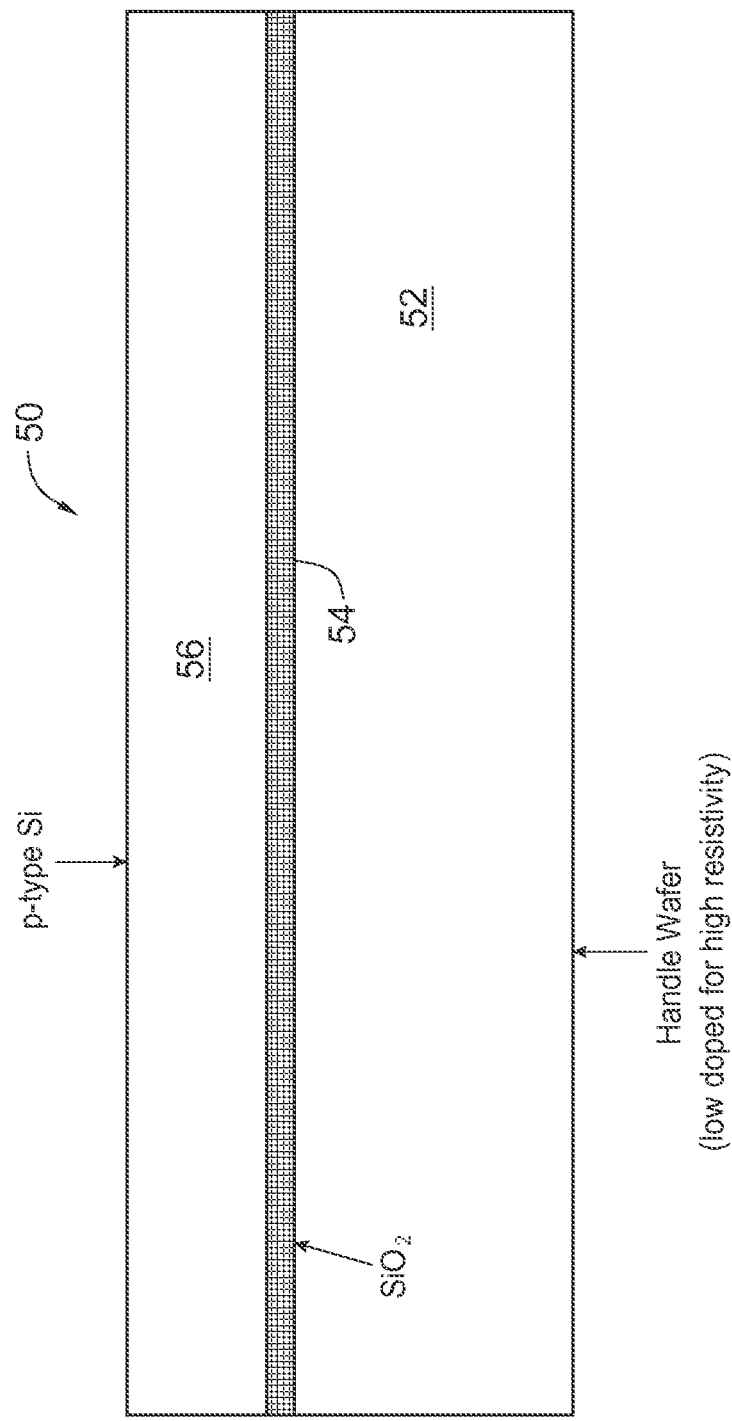
Figure 9D:
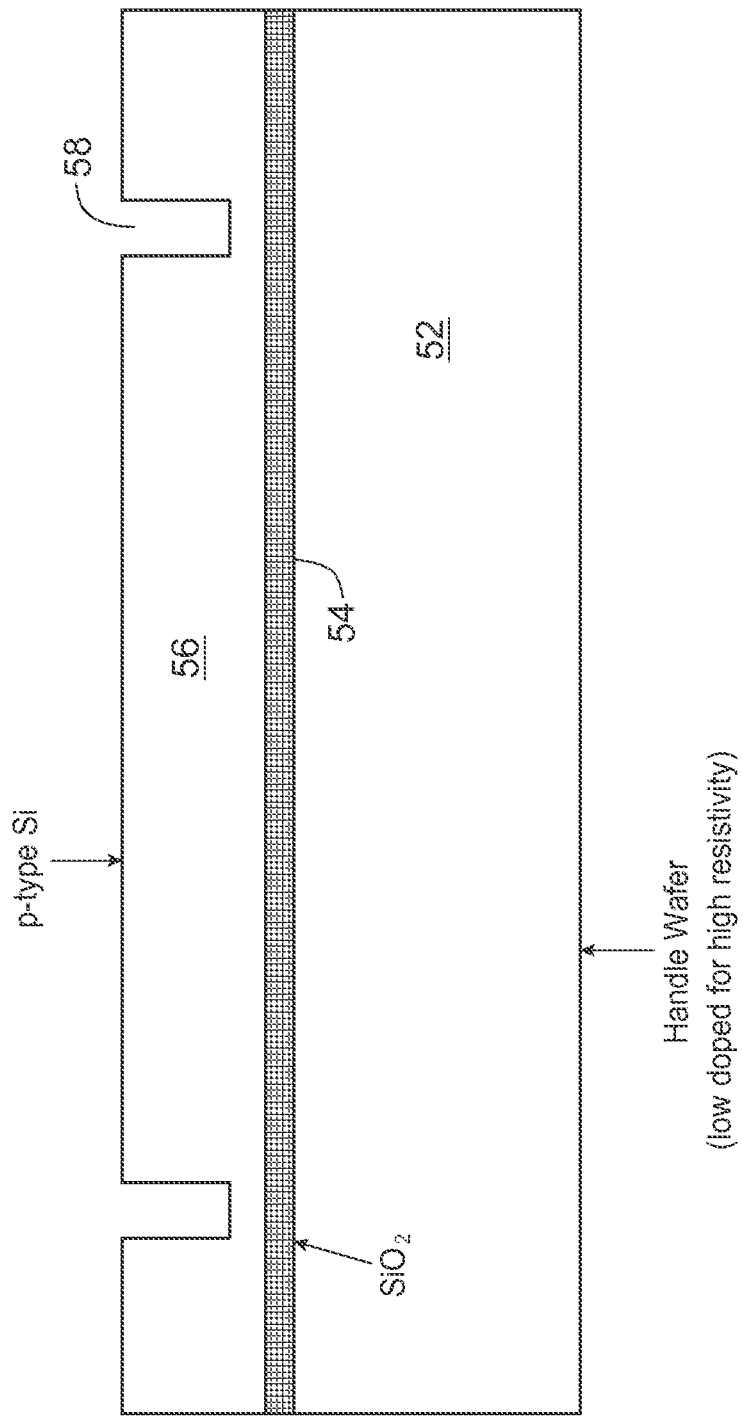
Figure 9E:
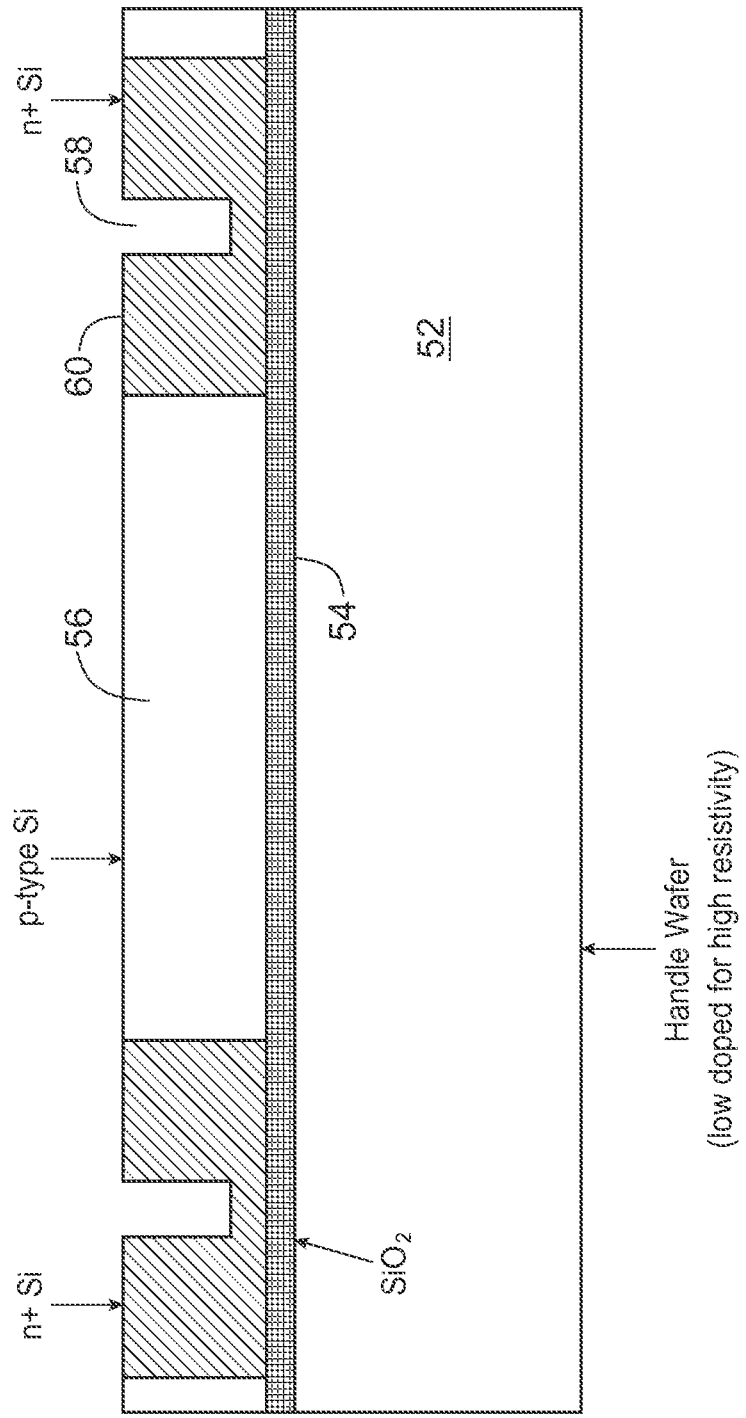
Figure 9F:
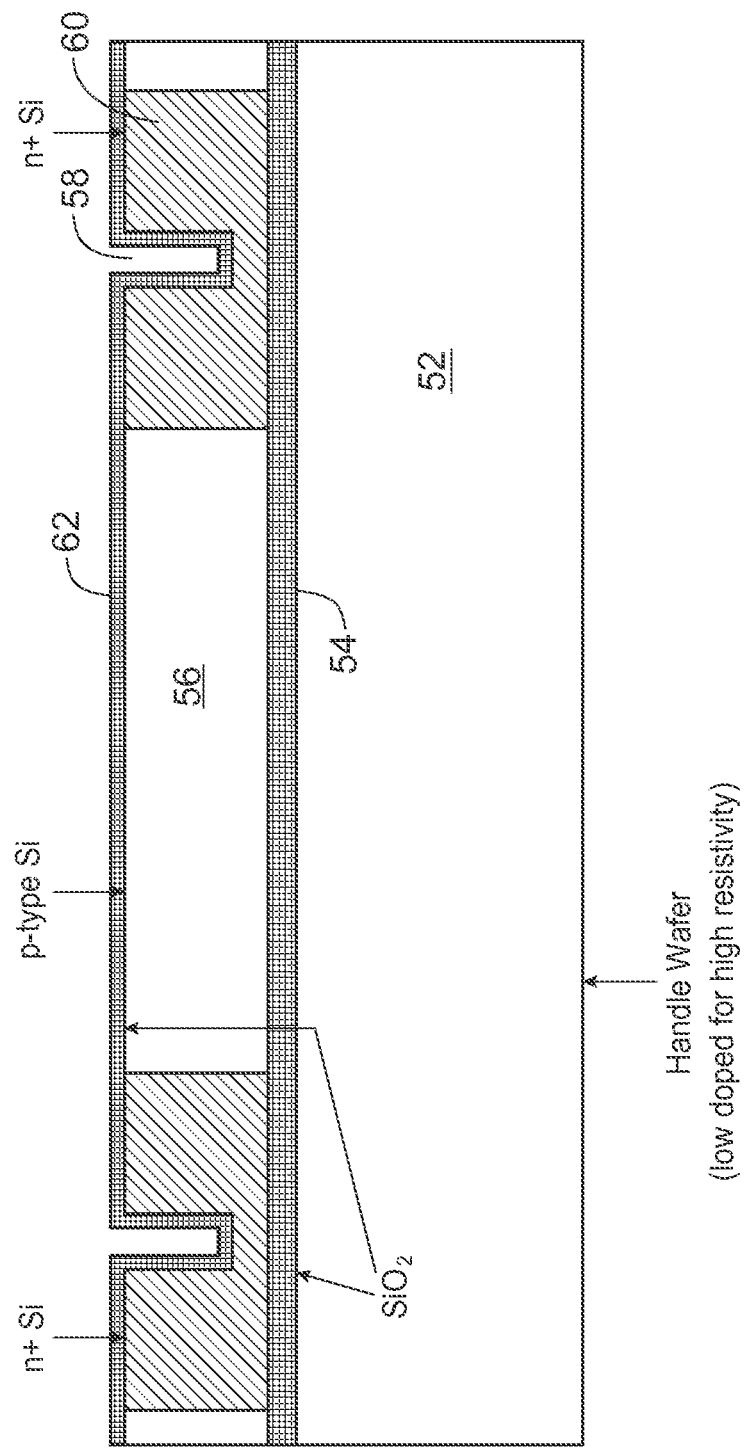
Figure 9G:
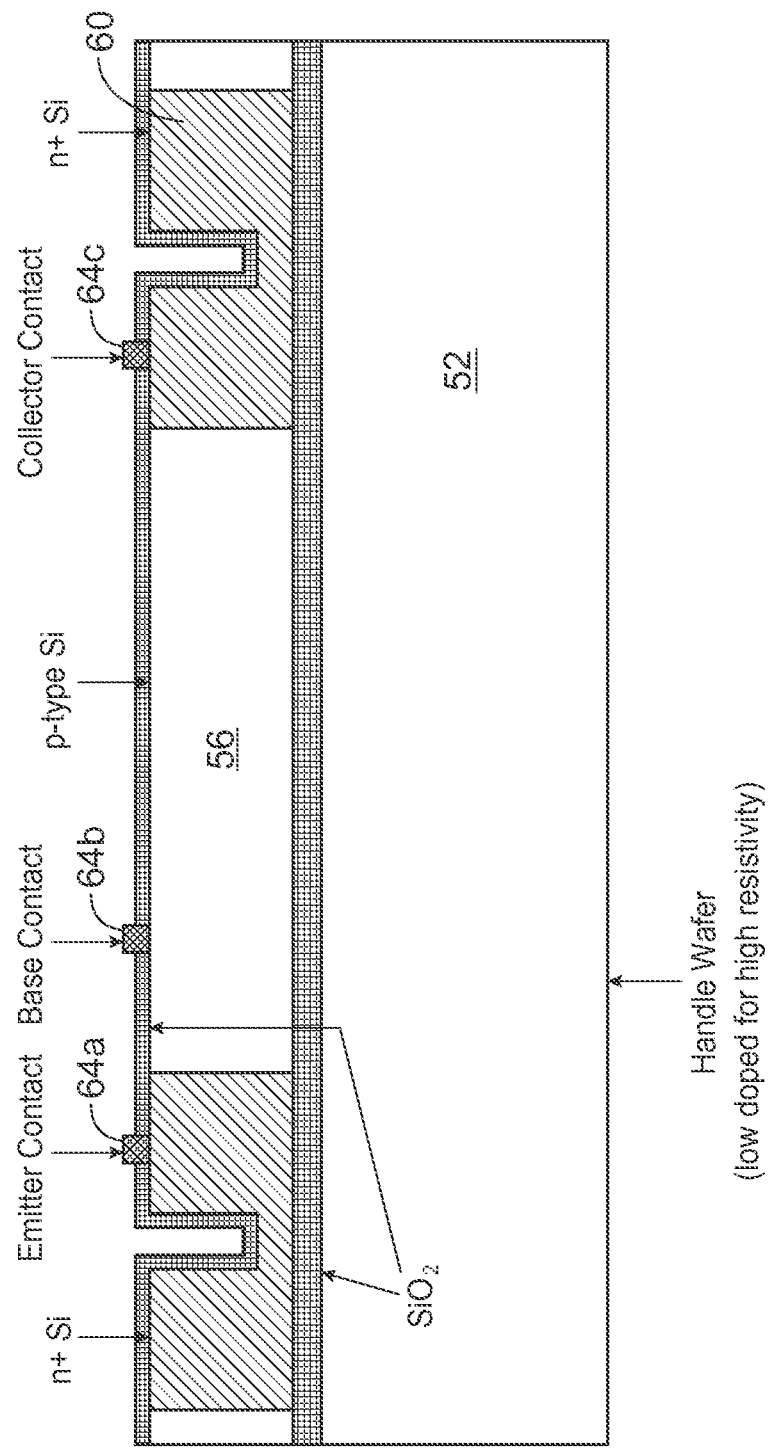

In FIG. 9C, a silicon on insulator wafer 50, including a handle wafer 52, a silicon dioxide layer 54, and a p-type silicon layer 56, is provided. Trenches 58 are etched into the device layer 56 to accommodate subsequent predeposition and diffusion steps in FIG. 9D. In FIG. 9E, a thermal predeposition and drive are performed, doping the silicon with an n-type dopant 60 in areas around the trenches 58. An oxidation in FIG. 9F forms silicon dioxide layer 62 over the entire top of the structure. Metal electrodes are deposited, allowing electrical contact to each of the three active regions (the emitter contact 64a, base contact 64b and collector contact 64c) in FIG. 9G. Subsequent steps can be conducted to form either on-wafer or off-wafer flexible devices.

Figure 9H:
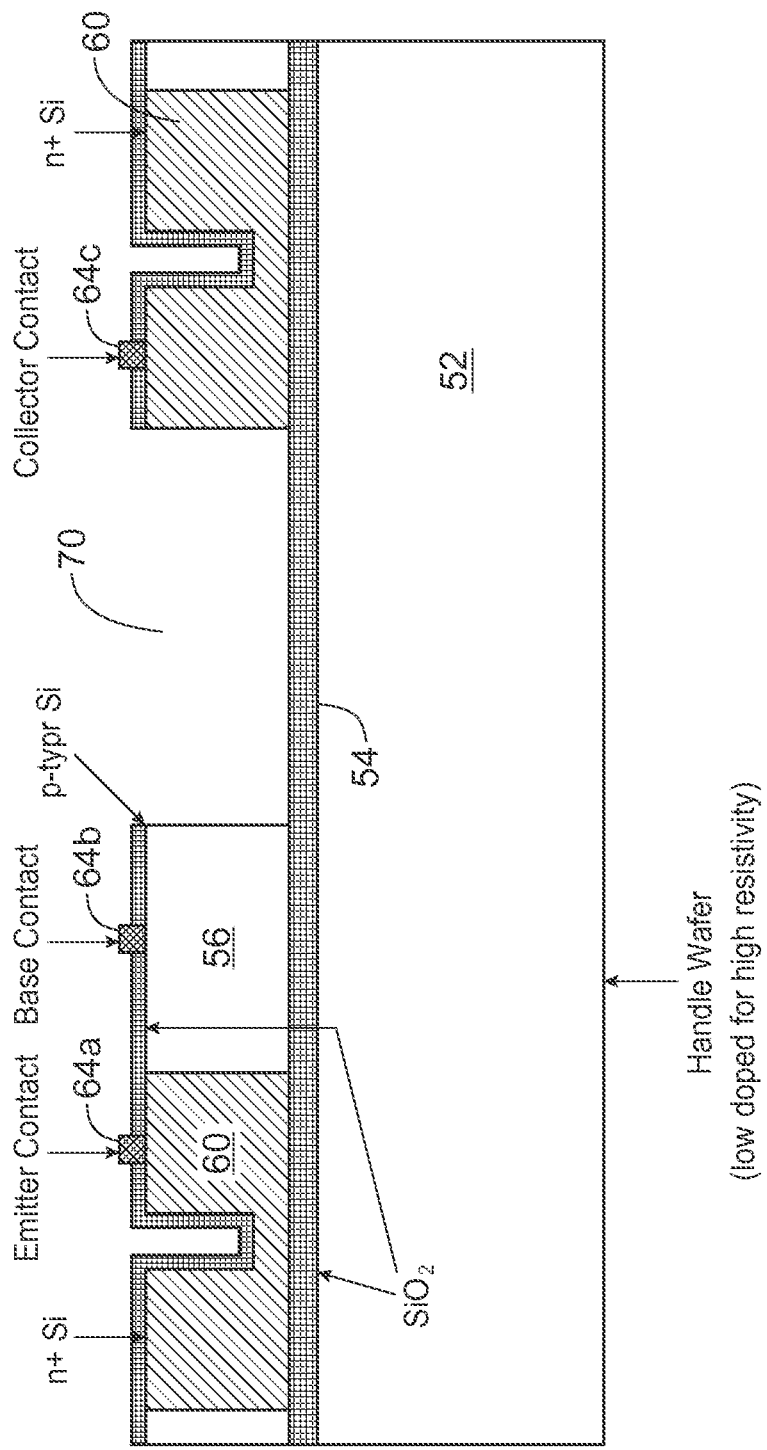
Figure 9I:
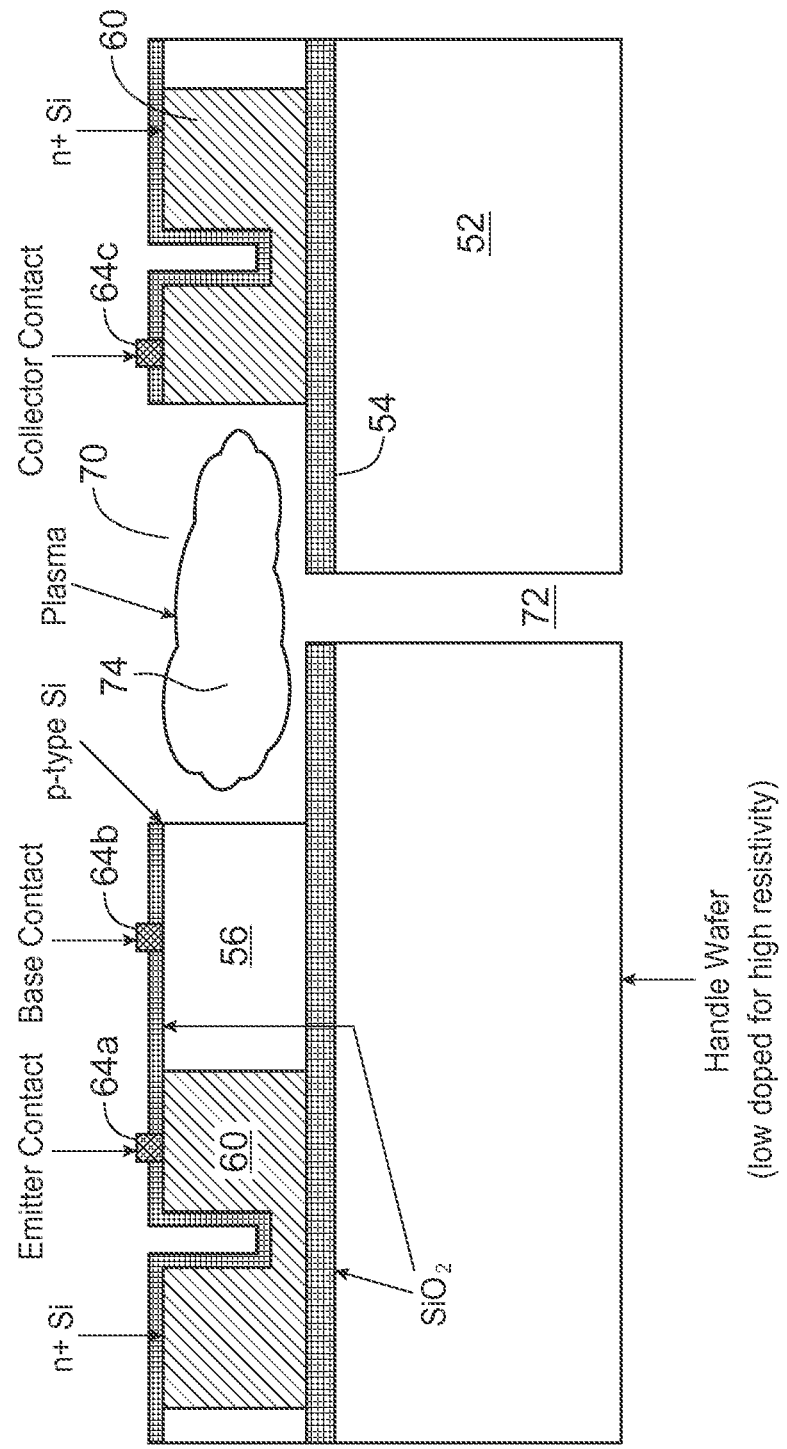

FIGS. 9H-9I illustrate the formation of, and the structure and arrangement of, an on-wafer device. In FIG. 9H, a cavity 70 is etched into the silicon device layer between the p-type base 56 and the n-type collector 60. This cavity 70 is where the plasma will be contained during operation of the lateral plasma transistor. FIG. 9H also illustrates a complete on-wafer device, and FIG. 9I illustrates a modified device in which a through-wafer via 72 can be included to allow gas exchange, either functioning as an inlet, outlet, or for the switching of gas between two cavities, the transistor as required by the application. The via 72 may, in some applications, serve as an outlet through which air is evacuated by a vacuum pump. In this case, the desired gas or gas mixture would subsequently be introduced into the cavity 70. FIG. 9I also illustrates plasma 74 acting as collector during device operation.

Figure 9J:
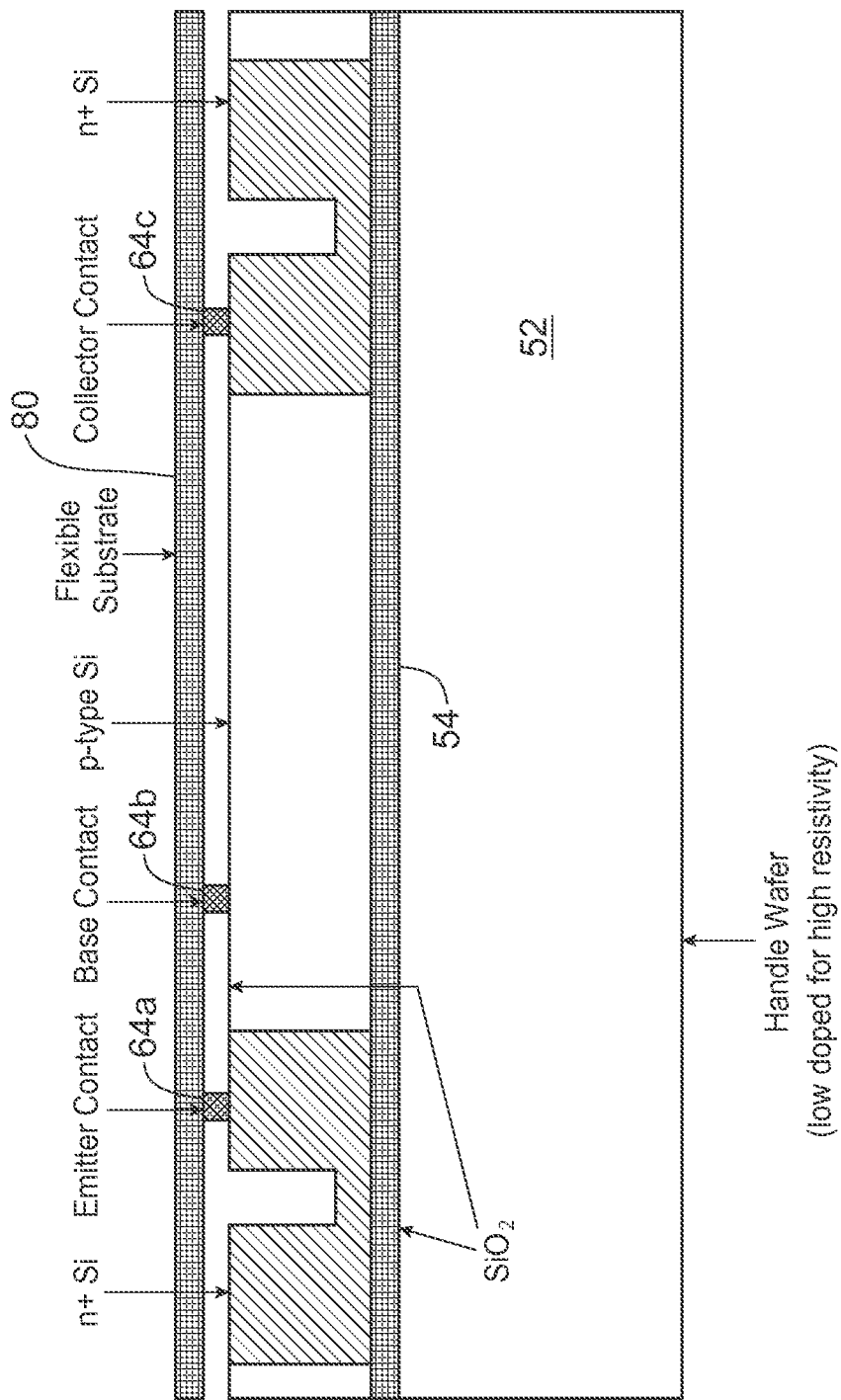
Figure 9K:
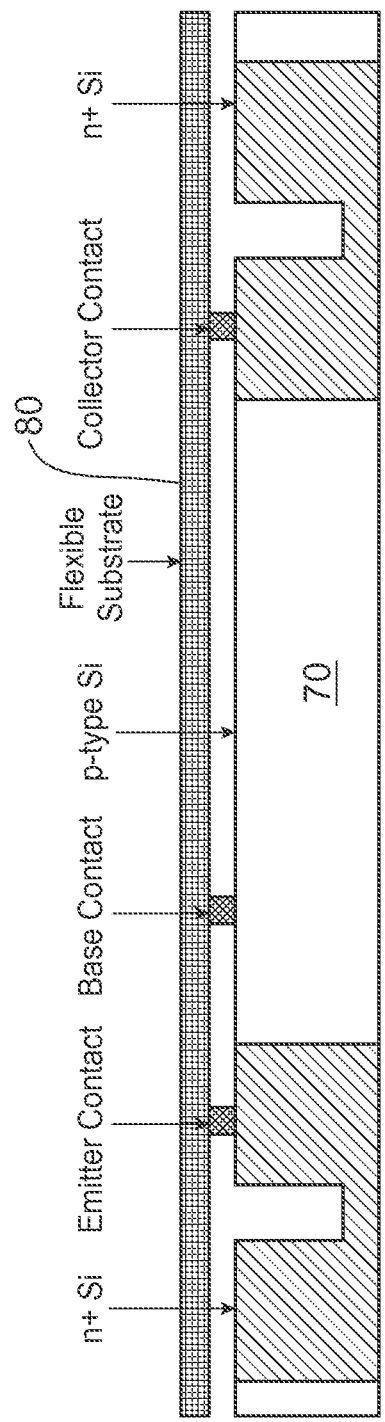
Figure 9L:
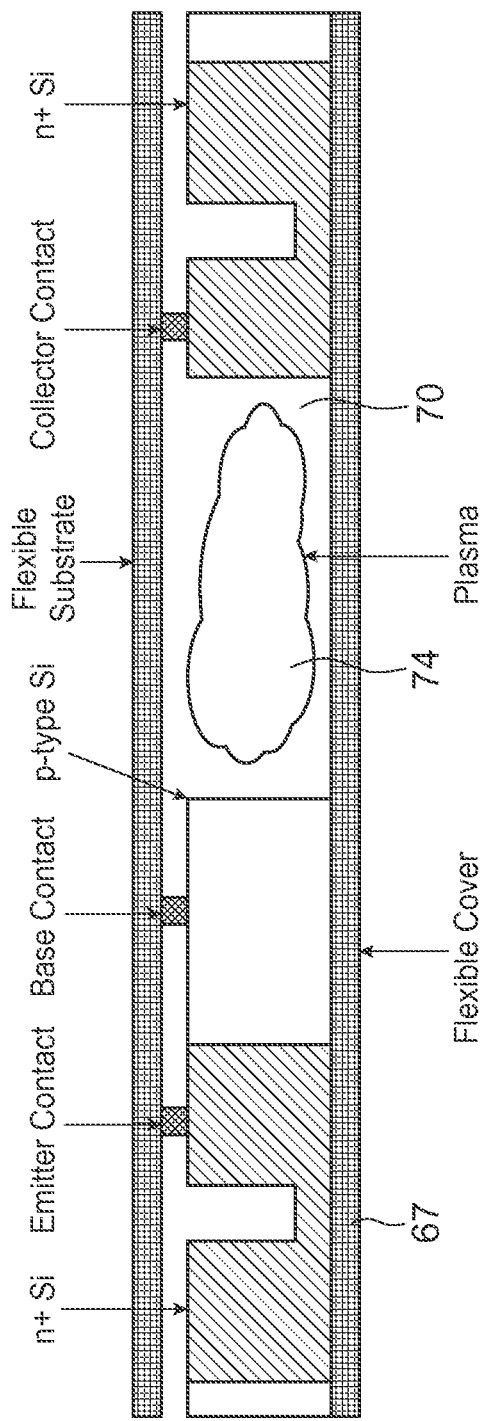

An alternative method for fabricating lateral transistors in a flexible package is illustrated in the figures following FIG. 9H. As shown in FIG. 9J, the entire assembly of FIG. 9G (with or without the uppermost layer of $SiO_2$ shown in FIG. 9G) is bonded to a flexible, metallized substrate 80, and in FIG. 9K, the handle wafer 52 and $SiO_2$ are removed. FIG. 9L illustrates a complete device after a cavity 70 is etched between the p-type base and the n-type collector and a flexible cover 82 is bonded to the device layer at the time the cover 82 is installed, a plasma is introduced into the cavity 70, where plasma 74 can be generated. Of importance for the flexible devices is the fact that thin membranes of silicon (such as the device layer) are, in fact, flexible, granting flexibility to the entire finished device, so long as the substrate and cover are sufficiently flexible as well. The on-wafer devices allow the entire device to be fabricated on one side of a SOI wafer, with fewer processing steps and greater robustness than previous designs. The addition of a through-wafer via allows for rapid gas exchange in this and all of the illustrated embodiments, should a particular application demand it (simple gas circulation for cooling purposes is one example). This design, due to its dimensions, lends itself readily to operation at pressures approaching or exceeding atmospheric pressure. The increased capability for cooling would make this device suitable for high-power switching, where power dissipation has traditionally been problematic.

The flexible devices of FIG. 9 allow the entire device to be fabricated onto a SOI wafer, which can be removed from the handle layer, and bonded to a flexible substrate, resulting in a flexible, finished product. The ability to switch light-emitting plasmas on and off with relatively low voltages, combined with the flexibility of these devices, allows for the possibility of flexible displays.

An example process consistent with the on-wafer design begins with an SOI wafer having a 15 µm thick p-Si layer, a 2

µm thick buried oxide film, and a 375 µm thick "handle" Si layer. A flexible support (substrate) can also be used to replace the handle layer, and such a flexible layer can be a plastic (such as PET), Kapton, polyimide, or a similar flexible material.

Figure 10A:
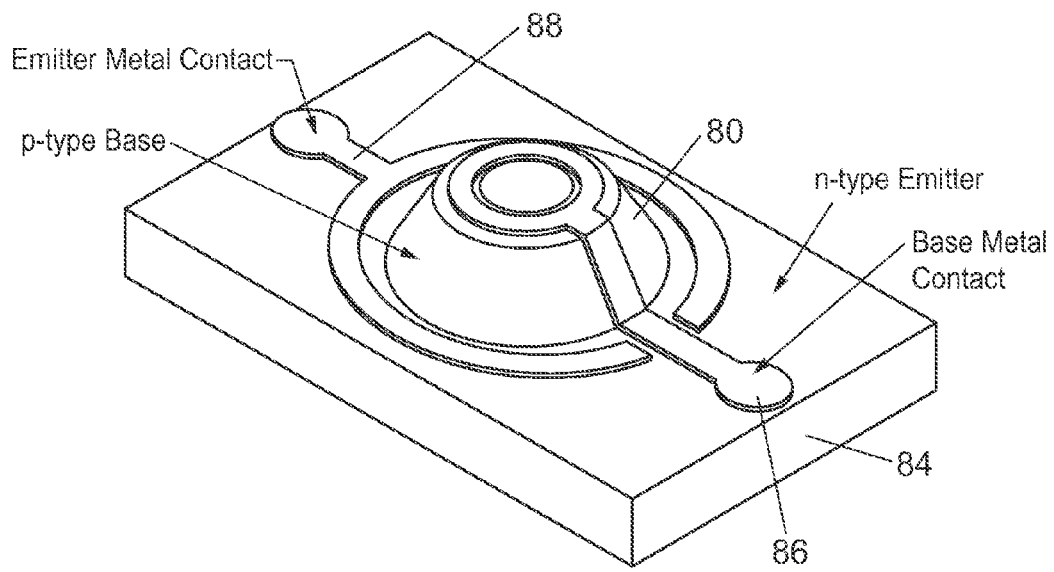
FIGS. 10A-10C illustrate a preferred embodiment mesa structure PBJT based on an epitaxial III-V wafer where the base and emitter regions are grown and then attached to a flexible substrate.
Figure 10B:
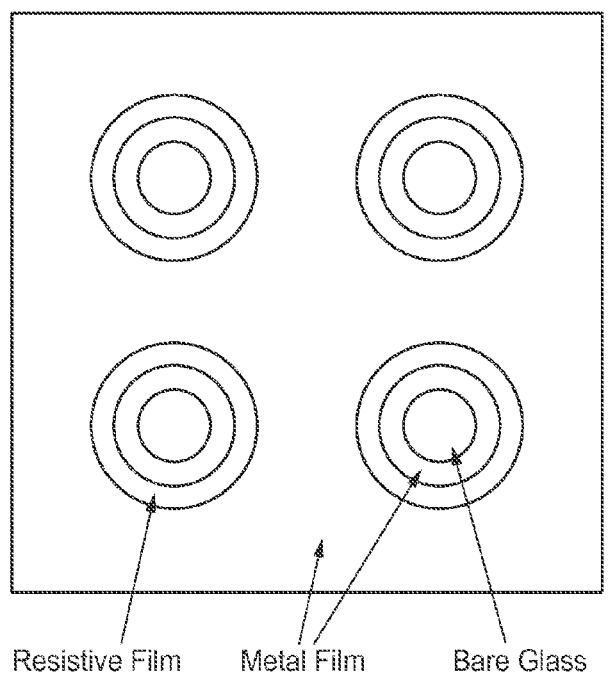
Figure 10C:
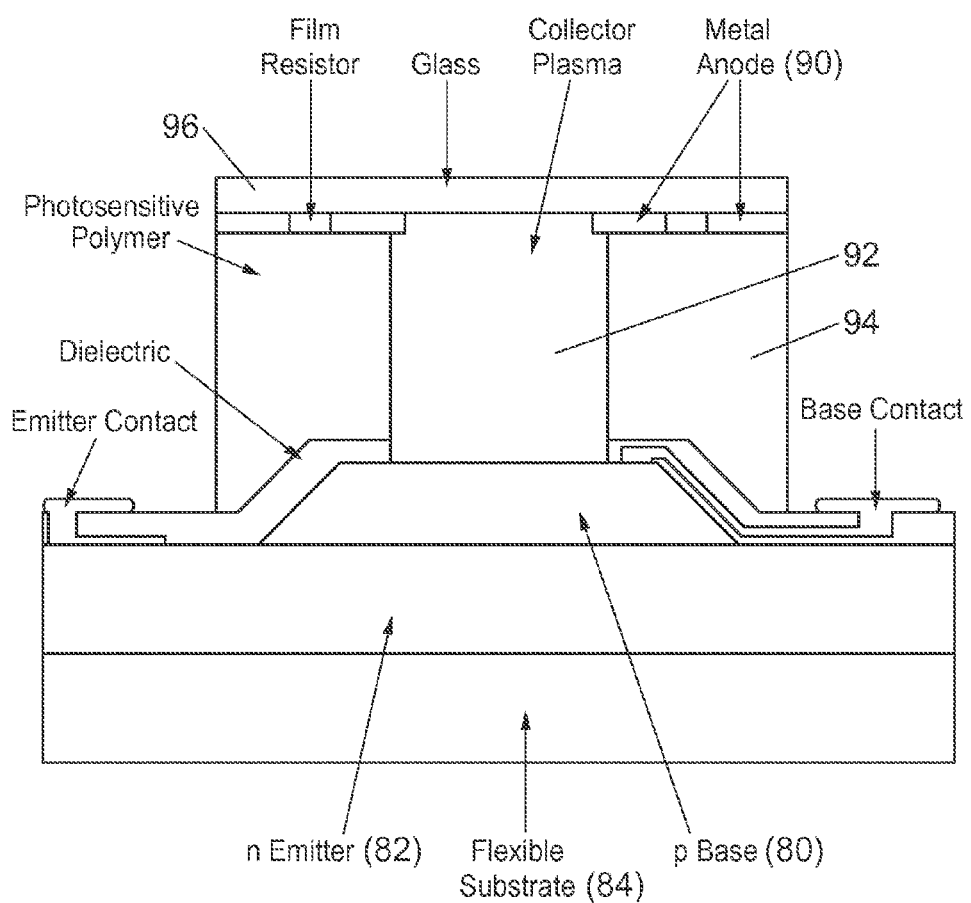

FIGS. 10A-10C show another preferred embodiment device that is based upon an epitaxial mesa structure. With reference to FIG. 10C, which best illustrates all of the layers, a p-type semiconductor layer 80 is grown on an n type substrate 82. The substrate 82 may be ultrathin and transferred to a flexible substrate 84 to allow for flexible devices. Base thickness as well as base and emitter doping levels can be the same as in U.S. Pat. No. 8,525,276, which is incorporated by reference herein. To form isolated base regions, the base 80 can be a mesa defined by selective etching (For silicon devices, a KOH bath with silicon nitride as the mask material can be used. This way a mesa can be formed with a sloped edge to avoid discontinuities of the base metal electrode across the mesa edge). The emitter electrode 88 and base electrode 86 can be formed by metallization. To complete the device, an anode 90 can be situated above the mesa 80 by evaporating or otherwise depositing a metal film onto the top of a housing 94 that encompasses cavity 92. A window (glass is shown in FIG. 10C) can be sealed onto the housing 94 and the film resistor shown in FIG. 10C, which is not necessary to the operation of the embodiment, can be included as a means to electrically isolate one mesa-type plasma transistor from the next. FIG. 10B shows, in plan view, the arrangement of the metal and resistive films for a small array of plasma transistors driven by a common voltage source.

To form the anode, metal may be deposited onto a glass substrate and regions opened up in the metal (via lithographic techniques) to allow a window above the device for light transmission and optionally allow for the incorporation of an annular ballast resistor. After the metal is removed, a thin film resistor is deposited. The anode piece is then aligned and placed on top of the mesa structure separated by a photosensitive polymer housing 94. This technique is easily transferrable to fabricating an array of mesa-based PBJT devices by employing appropriate photomasks.

Another embodiment of the invention is a mesa structure PBJT based on an epitaxial III-V wafer on which the base and emitter regions are grown and then attached to a flexible substrate. Metal organic chemical vapor deposition (MOCVD) forms multiple layers of GaAs and/or AlGaAs with composition and layer thickness that match device requirements. Each formed p-n junction made of GaAs and/or AlGaAs is separated by a sacrificial AlAs layer which is later selectively eliminated by etching in hydrofluoric acid, thereby releasing a large collection of p-n junctions, with size being defined before releasing. The released p-n junctions can be transferred and printed to a flexible substrate using a deterministic assembly procedure reported by others. See, Meitl, M. A. et al. "Transfer printing by kinetic control of adhesion to an elastomeric stamp" Nature Mater. 5, 33-38 (2006); Yoon, J. et al., "Ultrathin silicon solar microcells for semi-transparent, mechanically flexible and microconcentrator module design", Nature Materials 7, 907-915 (2008). A large array of devices can be easily formed in this way. The anode piece is later fabricated and aligned on top of the mesa structure in a fashion similar to that described earlier for the silicon mesa PBJT.

Figure 11A:
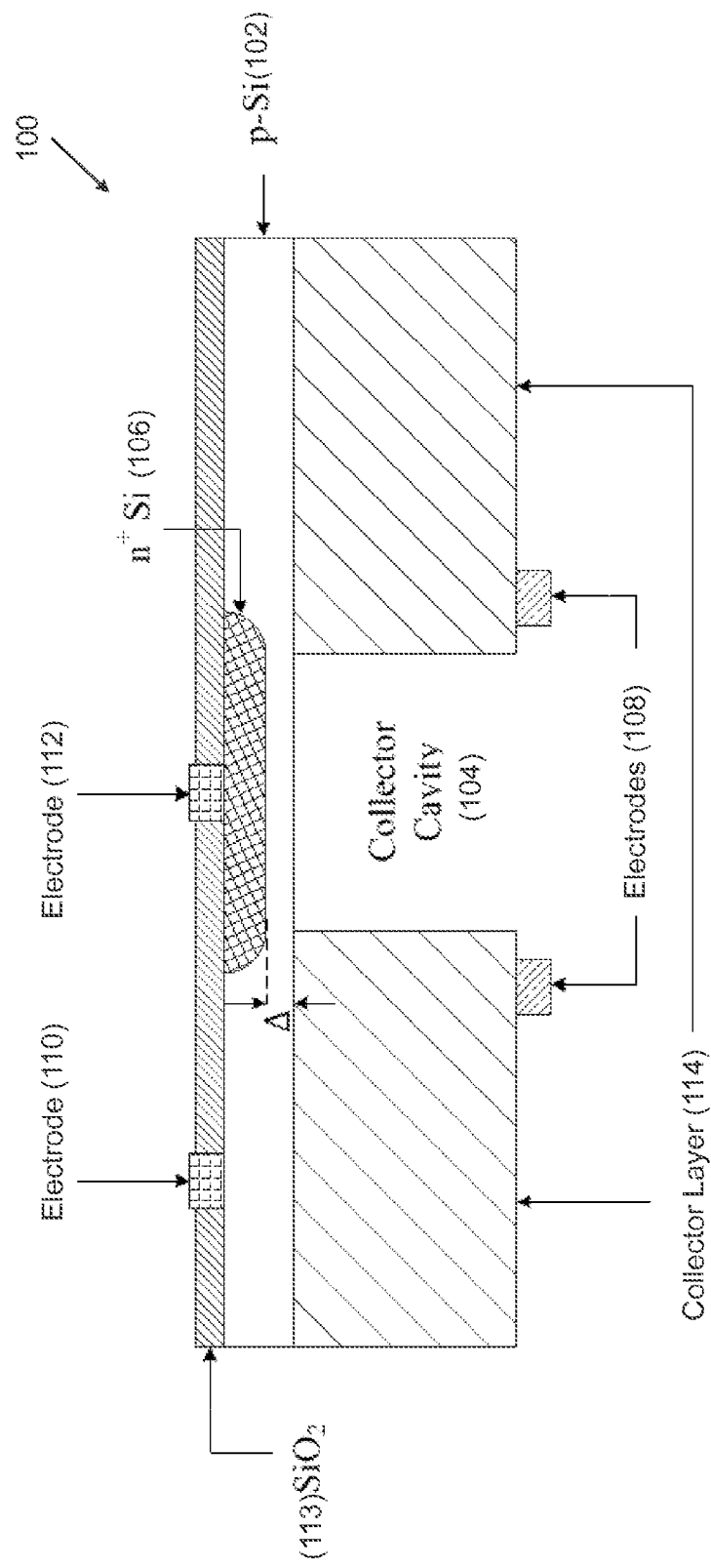
FIG. 11A illustrates a preferred embodiment flexible plasma bipolar junction transistor of the invention and FIGS. 11B-11F a preferred method for fabricating the flexible plasma bipolar transistor.

FIG. 11A illustrates a preferred mesa structure PBJT 100 that is based upon forming a thin epitaxial structure in silicon. However, this structure can also be formed in other semiconductor materials, such as Group III-V or II-VI materials.

For the preferred embodiment silicon device, a thin p-type Si layer 102 provides a base region that is defined by a thickness $\Delta$ between a collector microcavity 104 and the edge of an emitter region 106 of $n^+$ type Si that is formed by doping of the base layer 102. Collector electrodes 108 are preferably fabricated of tungsten, or other electrically conductive material that is resistant to sputtering and thermal damage. The electrodes 108 can be formed through a cover (not shown in FIG. 11A). Respective base and emitter electrodes 110 and 112 are similarly formed through openings in a silicon dioxide insulator layer 113. Plasma formed in the collector cavity 104 acts as a collector during operation of the PBJT. FIG. 11A is not to scale, and the relative thickness of a layer 114 that defines the collector cavity 104 is exaggerated. The layer 114 can be very thin, comparable in thickness to the base layer 102, and is also preferably thin enough to be flexible. In a preferred embodiment, the collector layer 114 is formed from polycarbonate, or another suitable polymer. These exemplary materials provide versatility regarding the cross-sectional shape of the collector microcavity 104. The overall thickness of the entire device structure after sealing the microcavity with a layer (not shown) can be, for example, less than 2 mm.

With an example polymer collector layer 114, a variety of cross-sectional shapes for the microcavity 104 can be formed by replica molding in the polymer substrate. Examples include parabolic, square, rectangular, and circular cross-sectional cavities. Specific and predetermined spatial distributions of the electric field strength can be obtained by selecting a specific cross-sectional shape for the microcavity 104. The collector electrodes 108 also preferably lie near the aperture of the collector microcavity 104. Electrode 108 may be a single entity, such as a ring lying at the edge of a cylindrical cavity, or it may have two or more components. Application of a DC or time-varying voltage between the electrodes 108 and the base 102 provides an electric field to sustain a collector plasma in the microcavity 104. For many PBJT applications, the collector plasma need not be continuous. In such instances, the voltage sustaining the collector plasma may be pulsed, and electrode(s) 108 may be coated with a dielectric that can be more robust.

The thickness $\Delta$ of the p-Si base layer 102 between the $n^+$-Si emitter and the collector cavity 104 also plays an important role in determining device electrical performance. A typical range for this parameter is ~1-50 µm. As $\Delta$ is increased, the current must be supplied to the base increases because of carrier recombination in the base. However, if the base region defined by $\Delta$ is made too thin, punchthrough might occur which will destroy the device. Therefore, the base thickness will represent a tradeoff between punchthrough and the required base current.

Figure 11B:
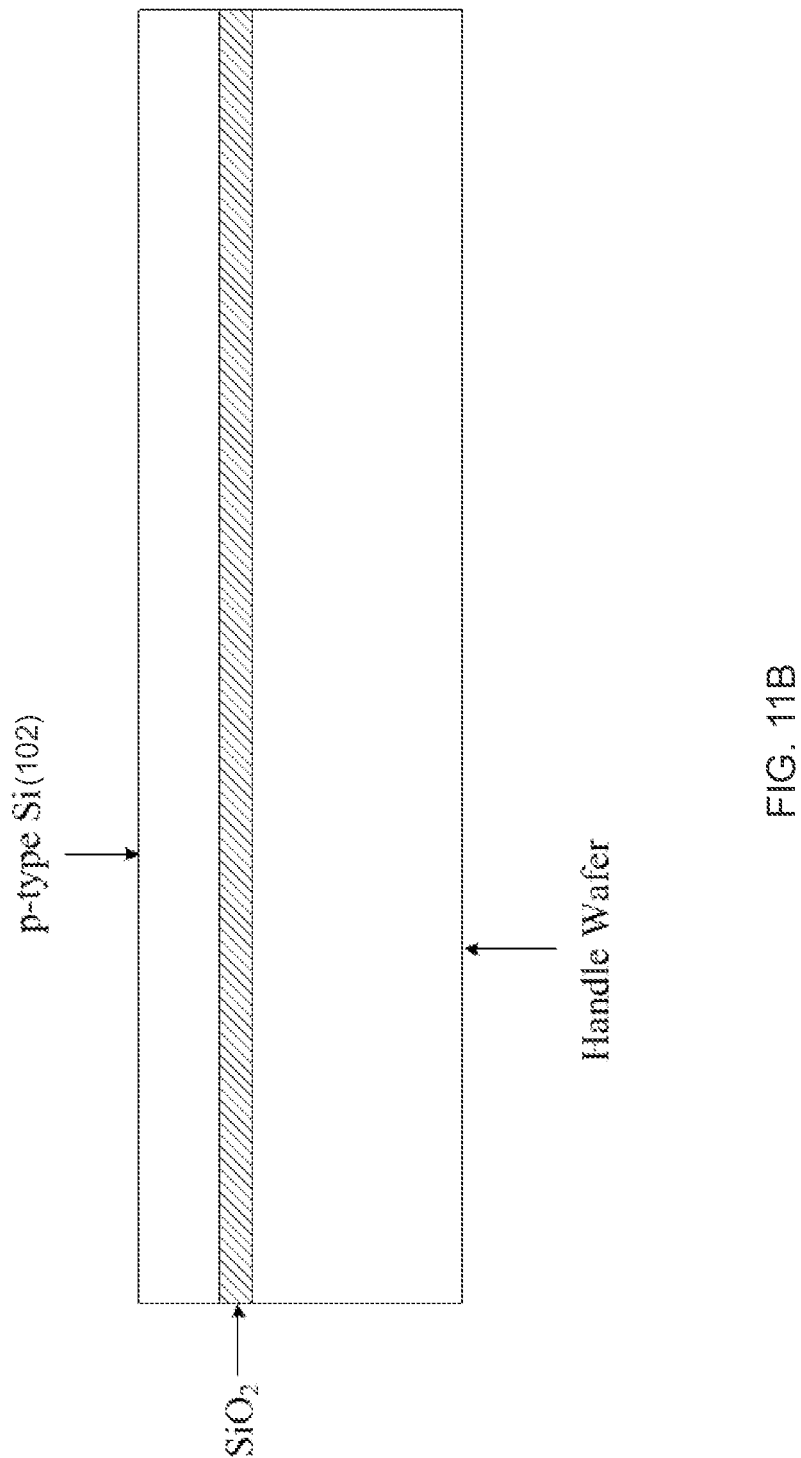
Figure 11C:
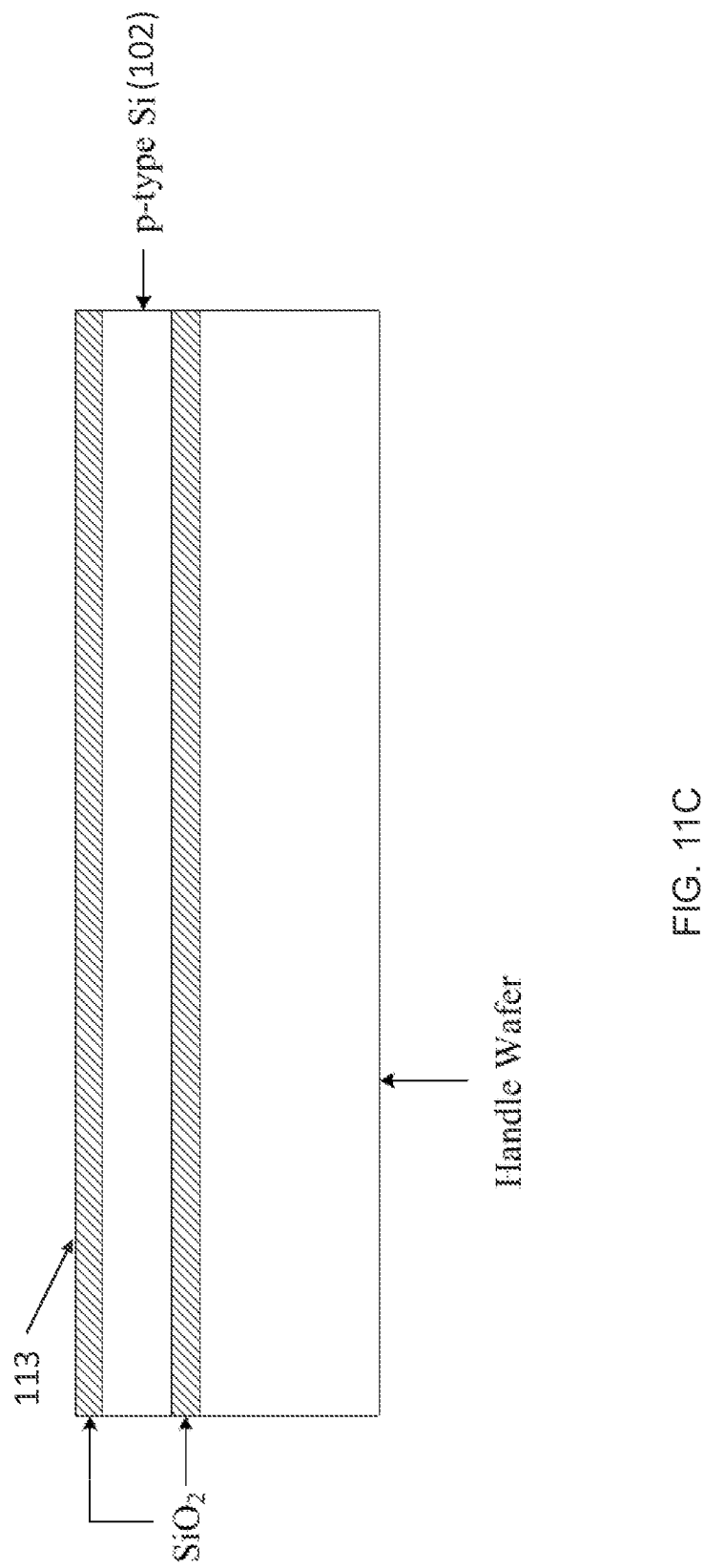
Figure 11D:
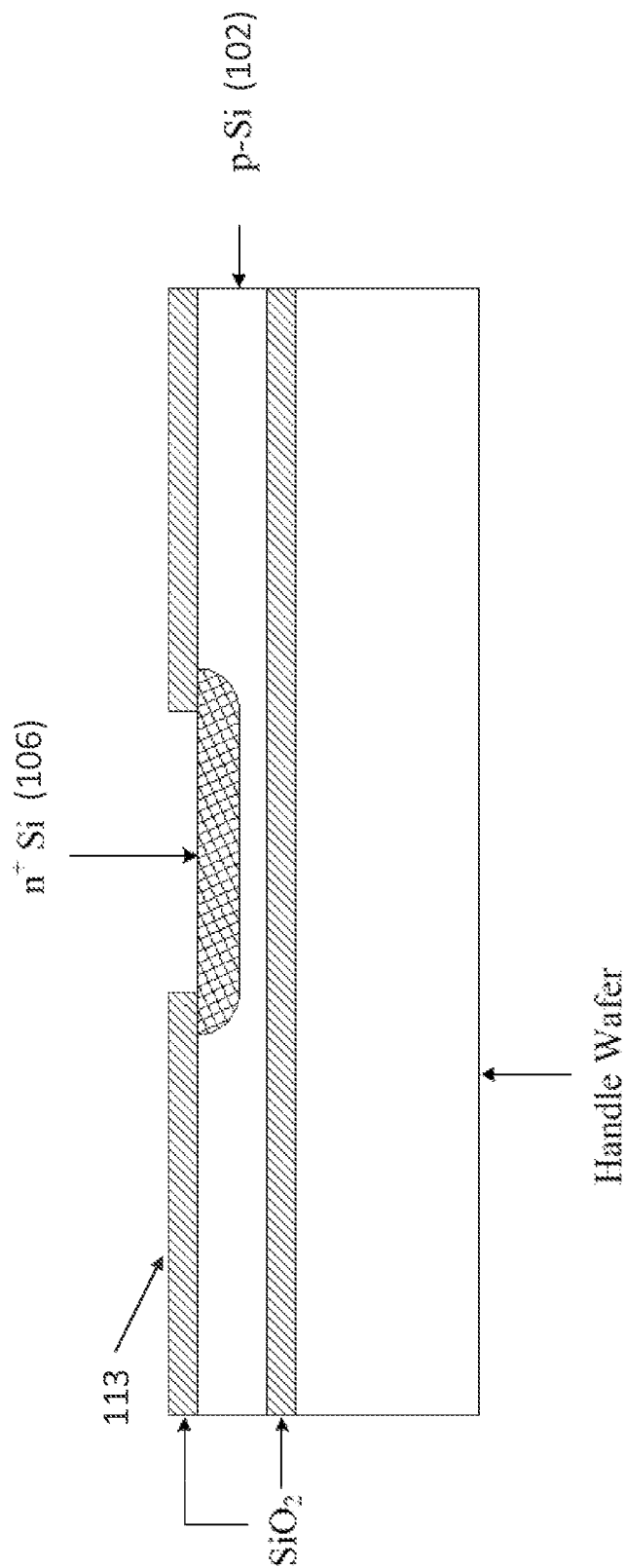
Figure 11E:
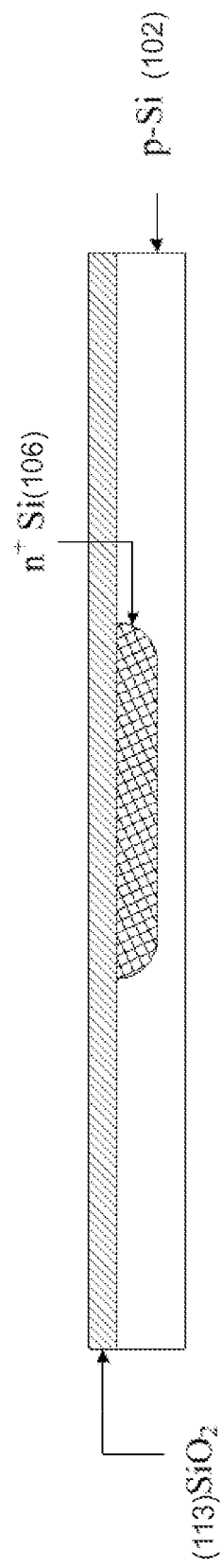
Figure 11F:
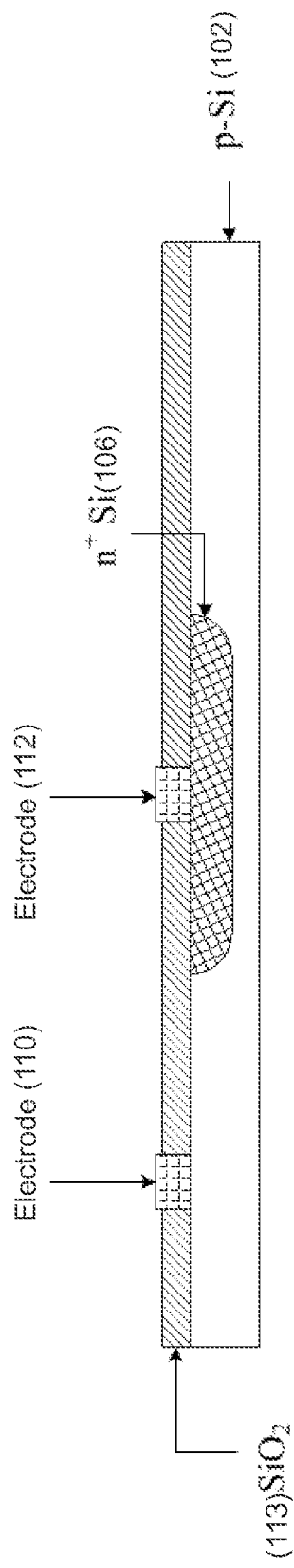

With reference to FIG. 11B, processing of the PBJT begins with an SOI wafer onto which a p-Si layer is deposited. An additional layer of $SiO_2$ is formed as the layer 113 in FIG. 11C. The layer 113 is opened in FIG. 11D and the $n^+$-Si emitter 106 is diffused into the layer 102. The handle layer and lower $SiO_2$ layer are removed in FIG. 11E, and the opening in $SiO_2$ layer 113 that was created for the emitter formation process, is now closed by an additional $SiO_2$ deposition. The formation of electrodes 110 (base) and 112 (emitter) in openings produced in the oxide layer 113 is shown if FIG. 11F. The structure of FIG. 11F can now be joined to a wide variety of collector microcavity layers, such as the polymers discussed with respect to FIG. 11A. Other options include plastics, ceramics and thin semiconductor layers.

Figure 12:
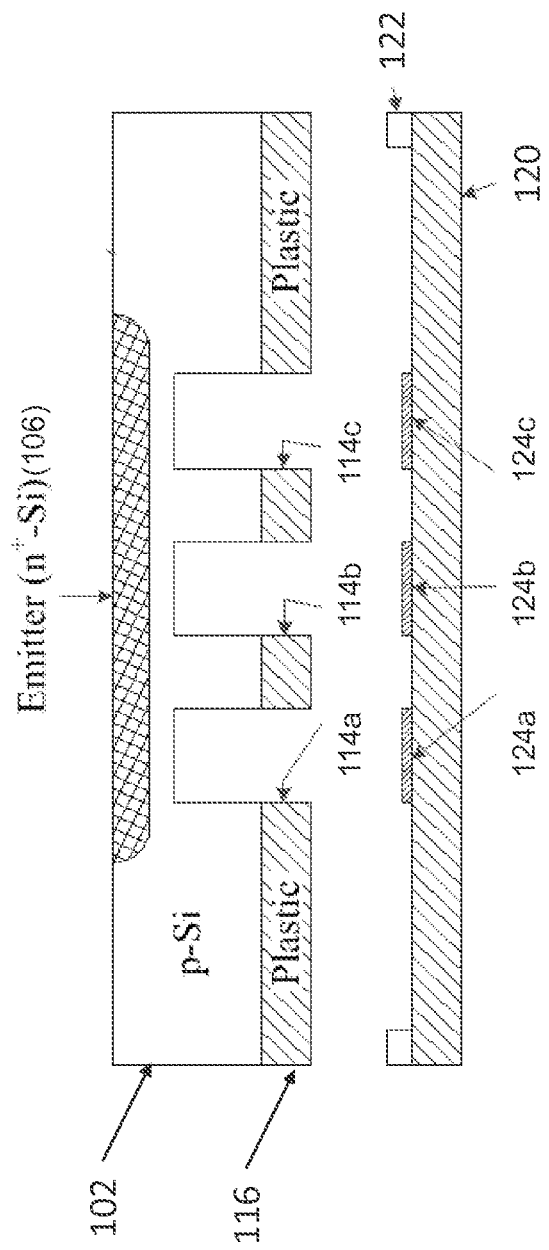
FIG. 12 illustrates a preferred embodiment flexible plasma bipolar junction transistor and single transistor logic gate of the invention having a plurality of collectors with a single emitter.

FIG. 12 illustrates another preferred embodiment device that has multiple microcavities 114a, 114b and 114c to serve as sub-collectors that share a common base region with a single emitter. An emitter region 106 is sized to encompass the three microcavities. With this arrangement, a signal emitter will share multiple collector microcavities. While three are shown as an example, many more can be associated with a single emitter region. The separate collector microcavities 114a, 114b and 114c share the same base, and multiple collector microplasmas can be controlled with a single base and emitter. This enables logic operations to be performed. The benefit of having two or more microcavities share a common emitter is that different plasma media (gases, vapors, or mixtures thereof) may be introduced to each of the microcavities. Therefore, light of different wavelengths in the ultraviolet, visible, or infrared can be generated, if desired, in each of the three microcavities. One example is coating the walls of microcavities 114A, 114B, and 114C with a red, green and/or blue phosphor. If, then, the plasma medium in microcavities 114 produces ultraviolet radiation when plasma is formed, the combined effect of the red, green, and blue emission is the appearance of white light to an observer. It should also be mentioned that in FIG. 12, the anodes 124a, 124b, and 124c are conducting but can also be optically transparent layers such as indium tin oxide (ITO).

A plastic layer 116 is bonded to the layer 102 prior to the formation of the microcavities 114a, 114b, and 114c. After bonding the thin plastic film 116 onto the p-Si semiconductor base layer 102, cavities are formed through the plastic sheet (layer) 116 and into the semiconductor base layer 102. The depth of penetration of the microcavities 114a, 114b, and 114c into the semiconductor 102 is determined by the desired thickness of the base region of the PBJT between the microcavities and the emitter 106. This thickness can be different for the separate microcavities 114a, 114b, and 114c or, if similar electrical behavior is desired from the three, the thickness can be the same for all. As discussed earlier, phosphor can be coated onto the walls of the microcavities 114a, 114b, and 114c, and the cavities filled with a plasma medium that, when a microplasma is formed within the cavities, will emit ultraviolet light and thereby produce visible fluorescence from the phosphor. A transparent cover 120 seals the device, which is spaced apart by spacer/sealant material 122. The cover can be formed from various materials, such as plastic, glass, quartz, sapphire, a thin crystal, or other materials that are preferably transparent. Collector electrodes 124a, 124b, 124c can also include a thin phosphor coating and can be formed, for example, opposite the cavities on the inner surface of the cover 120. The electrodes 124a, 124b, 124c can alternatively be arranged as in FIG. 11A. The base layer 102 can be thin and flexible as in preferred embodiment devices discussed above. However, the sub-collector device also can be formed in thicker semiconductor layers.

Figures 13A, 13B:
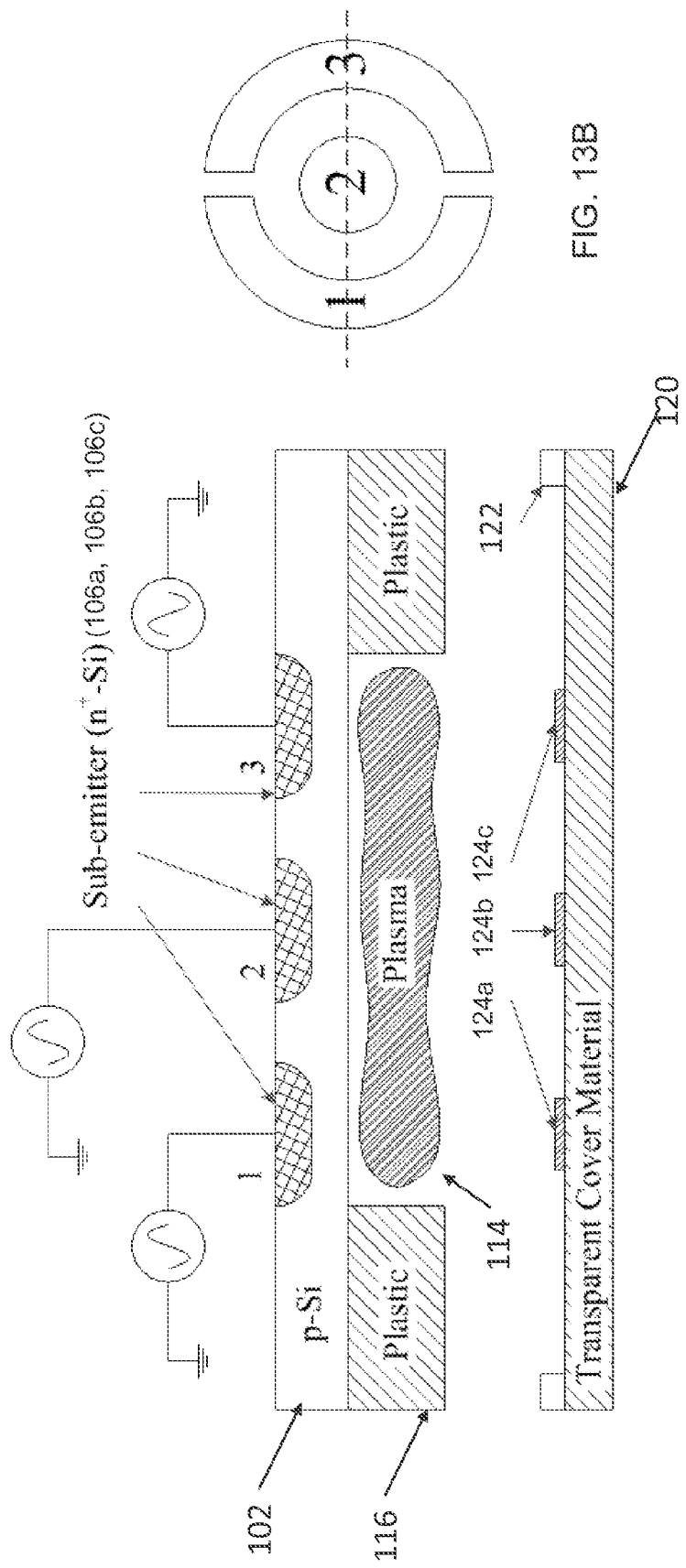
FIGS. 13A and 13B illustrate a preferred embodiment flexible plasma bipolar junction transistor and single transistor logic gate of the invention having a plurality of sub-emitters forming a common pn junction with a single collector.

FIGS. 13A and 13B illustrate another embodiment in which multiple sub-emitters 106a, 106b, and 106c share a single collector microcavity. This creates electrically-independent $n^+p$ junctions that all share a common microcavity 114 in which the PBJT collector plasma is formed during operation. The sub-emitters 106a, 106b, and 106c provide unique control over plasma generation, and the selective application of power can form different shaped plasmas, ranging from a ball in the vicinity of one of the sub-emitters to a spatially extended plasma. The sub-emitters 106a, 106b, and 106c permit modulation of the spatial distribution of the plasma and, therefore, also the light emitted by the plasma collector. FIG. 13B illustrates an example geometry of the $n^+$ sub-emitter regions 106a, 106b, and 106c (and also electrodes as in FIG. 11A, but which are omitted for simplicity of explanation, can be any of a wide variety of shapes. As with the sub-collector embodiments, the sub-emitter embodiments can also be formed in a variety of materials and need not be flexible.

An interesting aspect of the FIGS. 12-13B embodiments is the ability to support logic operations in what is essentially a single device, and would require multiple devices in standard semiconductor circuits. This provides the basis for new displays or information processing devices that take full advantage of the interaction of the semiconductor junction with a plasma. Using as an example the embodiment of FIGS. 13A and 13B, "turning on" one of the sub-emitters 1, 2, or 3 can serve to "bias" the remaining sub-emitters. That is, if one of the sub-emitters is first turned on, then the threshold in forward bias for igniting plasma in the vicinity of another sub-emitter (or enhancing the plasma already created by another sub-emitter) is reduced considerably. This permits unique operations for display applications, but also provides the ability to realize plasma logic gates such as a plasma AND gate. Artisans will also appreciate that the plasma can tolerate significant amounts of power, and can operate at power levels that would destroy solid-state logic gates. This provides the opportunity to directly integrate plasma logic in higher power applications without additional circuitry to protect the logic gates.

Unlike Ohki U.S. Pat. No. 7,235,860, in the present invention, charge carriers (electrons) injected into the collector plasma by emitter-base junction 106A (for example) can quickly diffuse through the collector plasma and strongly influence the electrical characteristics of emitter-base junctions 106B and 106C, working in conjunction with the collector plasma in microcavity 114. Specifically, applying a forward bias to the emitter-base junction 106A of FIG. 13A with the collector plasma present will reduce the "turn on" voltage but also increase the saturated collector currents associated with the emitter base 106B and emitter-base junctions 106C.

The sharing of a single collector plasma by multiple emitter-base junctions in a PBJT has the effect of coupling the individual emitter-base junctions. This behavior can be exploited in several ways, one of which is to realize logic devices. Consider, for example, two of the three sub-emitters having an annular shape, and, together, encompassing a third emitter having a circular cross-section. With this geometry, electron injection into the collector plasma by either or both of the annular emitter-base junctions will profoundly influence the operating characteristics. Therefore, if the forward bias for the third (circular) emitter-base junction is set slightly below turn-on, then operating the annular emitter-base junctions under forward bias will increase the collector conductivity and induce the third emitter-base junction to "turn on" as well. Hence, the three emitter structure of FIG. 13A, employing the emitter geometry of FIG. 13B, can function as an AND gate. A wide variety of sub-emitter geometries other than that of FIG. 13B can be used.

Another function that is served by the sub-emitter PBJT configuration of FIG. 13A is that one emitter-base junction can modulate the collector current produced by another. Specifically, if the sub-emitter-base junctions of FIG. 13A are driven by voltage waveforms of differing frequencies (and the waveforms need not be sinusoidal), then the oscillating collector current produced by (for example) the emitter-base junction 106A can be modulated by that generated by the emitter-base junction 106B and emitter-base junctions 106C. It is important to recognize that mixing of these frequencies will occur, such that sum and difference frequencies will be produced in the collector current. If the emitter-base 106A, emitter-base 106B, and emitter-base junctions 106C are driven at frequencies $f_1$, $f_2$, and $f_3$, respectively, the collector current will contain components at frequencies $f_1 \pm f_2$, $f_2 \pm f_3$, and so on.

Arrays of devices as illustrated in FIGS. 12 and 13 are, for example, well-suited for the fabrication of high resolution, full color displays. The transistors are also amenable to gas phase sensors requiring the modulation of a plasma into which an impurity has been introduced. Fluorescence diagnostics of such plasmas will enable the detection of toxic or environmentally "unfriendly" gases or vapors in air samples, for example. Excimer laser ablation and patterning techniques can also be used to fabricate the devices on flexible, low cost substrates having surface areas of at least 1 m².

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A method for providing a logic function with a single microplasma transistor device, the method comprising:
   generating a microplasma within a microcavity in proximity to a solid state semiconductor pn junction; and
   with one of a plurality of microplasmas forming sub-collectors with a common emitter, or a common collector plasma with a plurality of sub-emitter regions in the solid state semi-conductor pn-junction, generating a logic output from an electrode based upon electrode inputs to two other electrodes.

2. The method of claim 1, wherein the microplasma transistor device comprises a plurality of sub-collector microcavities that share a common base and emitter solid state regions, and said generating comprises applying input to base and emitter electrodes and the logic output is generated at a collector electrode.

3. The method of claim 1, wherein the plurality of sub-collector microcavities contain a plurality of plasma media.

4. The method of claim 1, further comprising generating a display while generating the logic output.

5. The method of claim 1, further comprising generating a plurality of wavelengths from a plurality of microplasmas.

6. The method of claim 5, wherein said plurality of wavelengths comprises a plurality of visible wavelengths.

7. The method of claim 1, wherein the single microplasma transistor device comprises a plurality of solid state sub-emitter regions that share a common base region and a common collector microcavity.

8. The method of claim 7, comprising three sub-emitter regions that share the common base region and the common collector microcavity, wherein two of the three sub-emitters regions have an annular shape and, together encompass a third sub-emitter region having a circular cross-section.

9. The method of claim 8, wherein said generating comprises biasing the third emitter-base junction slightly below turn-on, and forward biasing the first and second emitter-base junctions to provide an AND logic function.

10. The method of claim 7, wherein said generating comprises driving a plurality of sub-emitter and base junctions with voltage waveforms of differing frequencies to modulate the current of other sub-emitter and base junctions and provide sum and difference frequencies in collector current.

11. The method of claim 7, wherein said generating comprises first biasing a sub-emitter to turn it on to reduce threshold for igniting plasma in the vicinity of another sub-emitter.

12. The method of claim 1, wherein the single microplasma transistor device is in an array of microplasma transistor devices and additional logic functions are performed by devices in the array of microplasma transistor devices.

13. The method of claim 1, wherein the single microplasma transistor device comprises:
   a thin and flexible semiconductor base layer;
   a plurality of sub-emitter regions diffused into said thin and flexible base layer forming a plurality of pn-junctions;
   an insulator layer upon one side of said thin and flexible semiconductor base layer and said emitter region;
   base and sub-emitter electrodes isolated from each other by said insulator layer and electrically contacting said thin and flexible semiconductor base layer and said sub-emitter regions through said insulator layer;
   a thin and flexible collector layer upon an opposite side of said thin and flexible semiconductor base layer;
   a microcavity formed in said thin and flexible collector layer aligned with said plurality of emitter regions; and
   collector electrodes arranged to sustain a microplasma within said microcavity.

14. The method of claim 1, wherein the single microplasma transistor device comprises:
   a thin and flexible semiconductor base layer;
   an emitter region diffused into said thin and flexible base layer forming a pn-junction;
   an insulator layer upon one side of said thin and flexible semiconductor base layer and said emitter region;
   base and emitter electrodes isolated from each other by said insulator layer and electrically contacting said thin and flexible semiconductor base layer and said emitter region through said insulator layer;
   a thin and flexible collector layer attached to another said of said thin and flexible semiconductor base layer;
   a plurality of microcavities formed in said thin and flexible collector layer aligned with said emitter region; and
   collector electrodes arranged to sustain separate microplasmas within said plurality of microcavities.

15. A method for providing a logic function with a single microplasma transistor device, the method comprising:
   generating one or a plurality of microplasmas within one or a plurality of a microcavities in proximity to one or a plurality of solid state semiconductor pn junctions; and
   applying voltage waveforms to affect selected ones of the one or a plurality of microplasmas or the one or plurality of semiconductor pn junctions to influence electrical characteristics of other ones of the plurality of microplasmas or the plurality of semiconductor pn junctions to thereby provide the logic function.

16. The method of claim 15, wherein said applying reduces threshold voltage of one of the other ones of the plurality of pn junctions.

17. The method of claim 15, wherein said applying comprises biasing one of the other ones of the plurality of pn junctions by turning on the one or plurality of semiconductor pn junctions.

* * * * *